(12) United States Patent
Choi et al.

(10) Patent No.: US 10,559,626 B2
(45) Date of Patent: Feb. 11, 2020

(54) NEUROMORPHIC DEVICE INCLUDING A SYNAPSE HAVING CARBON NANO-TUBES

(71) Applicant: SK hynix Inc., Icheon (KR)

(72) Inventors: Yong-Soo Choi, Seongnam (KR); Keun Heo, Yongin (KR); Hyung-Dong Lee, Hwaseong (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/648,342

(22) Filed: Jul. 12, 2017

(65) Prior Publication Data

US 2018/0240846 A1 Aug. 23, 2018

(30) Foreign Application Priority Data

Feb. 20, 2017 (KR) ........................ 10-2017-0022014

(51) Int. Cl.
*H01L 27/28* (2006.01)
*H01L 51/00* (2006.01)
*H01L 51/05* (2006.01)
*G06N 3/063* (2006.01)
*B82Y 10/00* (2011.01)

(52) U.S. Cl.
CPC ......... *H01L 27/285* (2013.01); *G06N 3/0635* (2013.01); *H01L 51/0048* (2013.01); *H01L 51/0583* (2013.01); *B82Y 10/00* (2013.01); *Y10S 977/742* (2013.01)

(58) Field of Classification Search
CPC .............. H01L 27/285; H01L 51/0048; H01L 51/0583; G06N 3/0635; B82Y 40/00
See application file for complete search history.

(56) References Cited

U.S. PATENT DOCUMENTS

| | | | |
|---|---|---|---|
| 8,154,010 B2 | 4/2012 | Lee | |
| 9,349,543 B2* | 5/2016 | Lyon | ........................ H01G 11/36 |
| 9,390,790 B2* | 7/2016 | Bertin | ................. G11C 13/0002 |
| 9,559,298 B2* | 1/2017 | Ha | ........................... H01L 45/06 |
| 10,029,916 B2* | 7/2018 | Virkar | .................... B82Y 30/00 |
| 10,319,932 B2* | 6/2019 | Ning | .................... H01L 51/5072 |

(Continued)

OTHER PUBLICATIONS

Kim et al, "Carbon Nanotube Synaptic Transistor Network for Pattern Recognition", ACS Appl. Mater. Interfaces 2015, 7, 25479-25486.*

(Continued)

*Primary Examiner* — Ismail A Muse
*Assistant Examiner* — Charles N Ausar-El

(57) ABSTRACT

A neuromorphic device is provided. The neuromorphic device may include a pre-synaptic neuron; a row line extending in a row direction from the pre-synaptic neuron; a post-synaptic neuron; a column line extending in a column direction from the post-synaptic neuron; and a synapse disposed at an intersection between the row line and the column line. The synapse may include a first synapse layer including a plurality of first carbon nano-tubes; a second synapse layer including a plurality of second carbon nano-tubes having different structures from the plurality of first carbon nano-tubes; and a third synapse layer including a plurality of third carbon nano-tubes having different structures from the plurality of first carbon nano-tubes and the plurality of second carbon nano-tubes.

15 Claims, 31 Drawing Sheets

(56) References Cited

U.S. PATENT DOCUMENTS

| | | | | |
|---|---|---|---|---|
| 2004/0036128 A1* | 2/2004 | Zhang | B82Y 10/00 257/401 |
| 2006/0276056 A1* | 12/2006 | Ward | B82Y 10/00 438/800 |
| 2007/0018228 A1* | 1/2007 | Sandhu | B82Y 10/00 257/315 |
| 2007/0096616 A1* | 5/2007 | Han | H01L 21/76852 313/309 |
| 2007/0133266 A1* | 6/2007 | Furukawa | B82Y 10/00 365/160 |
| 2007/0155064 A1* | 7/2007 | Chen | B82Y 10/00 438/142 |
| 2007/0158697 A1* | 7/2007 | Choi | B82Y 10/00 257/246 |
| 2007/0241319 A1* | 10/2007 | Chang | B82Y 10/00 257/3 |
| 2008/0025262 A1* | 1/2008 | Kim | H04W 36/0083 370/331 |
| 2008/0182408 A1* | 7/2008 | Lee | H01L 21/76814 438/675 |
| 2008/0233744 A1* | 9/2008 | Kaul | B82Y 10/00 438/684 |
| 2009/0001343 A1* | 1/2009 | Schricker | H01L 27/2409 257/4 |
| 2009/0001345 A1* | 1/2009 | Schricker | G11C 13/0004 257/4 |
| 2009/0166609 A1* | 7/2009 | Schricker | B82Y 10/00 257/40 |
| 2009/0166610 A1* | 7/2009 | Schricker | B82Y 10/00 257/40 |
| 2009/0168491 A1* | 7/2009 | Schricker | B82Y 10/00 365/148 |
| 2009/0256130 A1* | 10/2009 | Schricker | G11C 13/0009 257/4 |
| 2009/0256131 A1* | 10/2009 | Schricker | B82Y 10/00 257/4 |
| 2009/0302301 A1* | 12/2009 | Hwang | H01L 27/2436 257/4 |
| 2010/0044671 A1* | 2/2010 | Schricker | B82Y 10/00 257/4 |
| 2010/0072445 A1* | 3/2010 | Schricker | B82Y 10/00 257/2 |
| 2010/0108981 A1* | 5/2010 | Jayasekara | B82Y 10/00 257/5 |
| 2010/0108982 A1* | 5/2010 | Ping | B82Y 10/00 257/5 |
| 2011/0012081 A1 | 1/2011 | Yoon et al. | |
| 2012/0001150 A1* | 1/2012 | Schricker | B82Y 10/00 257/9 |
| 2013/0075685 A1* | 3/2013 | Li | G11C 13/0002 257/3 |
| 2016/0012975 A1* | 1/2016 | Maruyama | C01B 32/162 136/252 |
| 2016/0267379 A1* | 9/2016 | Eleftheriou | G11C 11/5678 |
| 2016/0321537 A1* | 11/2016 | Akopyan | G06F 9/50 |
| 2016/0371583 A1* | 12/2016 | Hosokawa | G06N 3/049 |
| 2016/0379110 A1* | 12/2016 | Eleftheriou | G06N 3/049 706/33 |
| 2017/0193353 A1* | 7/2017 | Lee | G06N 3/063 |
| 2017/0193357 A1* | 7/2017 | Lee | G06N 3/0635 |
| 2017/0193358 A1* | 7/2017 | Lee | G06N 3/049 |
| 2017/0193359 A1* | 7/2017 | Park | G06N 3/049 |
| 2017/0193363 A1* | 7/2017 | Lee | G06N 3/08 |
| 2017/0193365 A1* | 7/2017 | Park | G06N 3/08 |
| 2017/0194337 A1* | 7/2017 | Lee | H01L 27/11521 |
| 2017/0194446 A1* | 7/2017 | Lee | H01L 29/42368 |
| 2017/0300806 A1* | 10/2017 | Lee | G06N 3/04 |
| 2018/0197918 A1* | 7/2018 | Bertin | G11C 13/0069 |
| 2018/0214042 A1* | 8/2018 | Signaevsky | A61B 5/04001 |
| 2019/0236444 A1* | 8/2019 | Cassidy | G06N 3/0445 |
| 2019/0279093 A1* | 9/2019 | Gokmen | G06N 3/084 |
| 2019/0294952 A1* | 9/2019 | Eleftheriou | G06N 3/049 |

OTHER PUBLICATIONS

Simien et al., "influence of Naontobe Length on the Optical and Conductivity Properties of Single-Wall Carbon Nanotube Networks", ACS NANO Article, vol. 2, No. 9, 1879-1884, 2008.*

Zhao et al., "Functional Model of Carbon Nanotube Programmable Resistors for Hybrid Nano/CMOS Circuit Design", Nano-Net 2009, LNICST 20, pp. 105-110, 2009.*

* cited by examiner

NEUROMORPHIC DEVICE INCLUDING A SYNAPSE HAVING CARBON NANO-TUBES

CROSS-REFERENCE TO RELATED APPLICATIONS

The present application claims priority to Korean Patent Application No. 10-2017-0022014, filed on Feb. 20, 2017, which is incorporated herein by reference in its entirety.

BACKGROUND

1. Field

The present disclosure relates to a neuromorphic device including a synapse having carbon nano-tubes.

2. Description of the Related Art

Recently, much attention has been paid to devices in the field of neuromorphic technology, which use chips that mimic the human brain. A neuromorphic device based on the neuromorphic technology may include a plurality of pre-synaptic neurons, a plurality of post-synaptic neurons, and a plurality of synapses. The neuromorphic device outputs pulses or spikes having various levels, amplitudes, and/or times, according to a learning state of the neuromorphic device. The synapses of the neuromorphic device have multiple resistance levels. The resistance of the synapses should be linearly changed.

SUMMARY

Embodiments of the present disclosure relate to a neuromorphic device including a synapse having carbon nano-tubes.

Embodiments of the present disclosure relate to methods for fabricating the neuromorphic device including the synapse having carbon nano-tubes.

Other embodiments of the present disclosure are not limited to the aforementioned embodiments, and those skilled in the art may clearly understand the other embodiments based on the following descriptions.

In an embodiment of present disclosure, a neuromorphic device may include a pre-synaptic neuron; a row line extending in a row direction from the pre-synaptic neuron; a post-synaptic neuron; a column line extending in a column direction from the post-synaptic neuron; and a synapse disposed at an intersection between the row line and the column line. The synapse may include a first synapse layer including a plurality of first carbon nano-tubes; a second synapse layer including a plurality of second carbon nano-tubes having different structures from the plurality of first carbon nano-tubes; and a third synapse layer including a plurality of third carbon nano-tubes having different structures from the plurality of first carbon nano-tubes and the plurality of second carbon nano-tubes.

The plurality of first carbon nano-tubes may have first lengths, the plurality of second carbon nano-tubes may have second lengths, and the plurality of third carbon nano-tubes may have third lengths. The first lengths, the second lengths, and the third lengths may be different from each other.

The plurality of first carbon nano-tubes may have first diameters, the plurality of second carbon nano-tubes may have second diameters, and the plurality of third carbon nano-tubes may have third diameters. The first diameters, the second diameters, and the third diameters may be different from each other.

The plurality of first carbon nano-tubes may include single-wall nano-tubes, the plurality of second carbon nano-tubes may include double-wall nano-tubes, and the plurality of third carbon nano-tubes may include multi-wall nano-tubes.

The synapse may further include a capping layer disposed on the first to third synapse layers. The capping layer may include a plurality of horizontal carbon nano-tubes that are densely and horizontally arranged in the capping layer. The plurality of horizontal carbon nano-tubes may be arranged denser than the pluralities of the first to third nano-tubes.

Lengths of the horizontal carbon nano-tubes may be longer than lengths of the third carbon nano-tubes.

The synapse may further include a fourth synapse layer including a plurality of fourth carbon nano-tubes having different structures from the first to third carbon nano-tubes; and a fifth synapse layer including a plurality of fifth carbon nano-tubes having different structures from the pluralities of first to fourth carbon nano-tubes.

In an embodiment of present disclosure, a neuromorphic device may include a lower electrode; an upper electrode; and a synapse disposed between the lower electrode and the upper electrode. The synapse may include a lower synapse layer having a plurality of first carbon nano-tubes; a middle synapse layer having a plurality of second carbon nano-tubes; and an upper synapse layer having a plurality of third carbon nano-tubes.

Second lengths of the plurality of second carbon nano-tubes may be longer than first lengths of the plurality of first carbon nano-tubes. Third lengths of the plurality of third carbon nano-tubes may be longer than the second lengths of the plurality of second carbon nano-tubes.

Second diameters of the plurality of second carbon nano-tubes may be greater than first diameters of the plurality of first carbon nano-tubes. Third diameters of the plurality of third carbon nano-tubes may be greater than the second diameters of the plurality of second carbon nano-tubes.

The plurality of first carbon nano-tubes may include single-wall nano-tubes, the plurality of second carbon nano-tubes may include double-wall nano-tubes, and the plurality of third carbon nano-tubes may include multi-wall nano-tubes.

The synapse may further include a capping layer disposed on the upper synapse layer. The capping layer may include a plurality of horizontal carbon nano-tubes that are densely and horizontally arranged in the capping layer. The plurality of horizontal carbon nano-tubes may be arranged denser than the pluralities of the first to third nano-tubes.

Lengths of the horizontal carbon nano-tubes may be longer than lengths of the plurality of third carbon nano-tubes.

The neuromorphic device may further include a lower interconnection layer; a lower via plug connecting the lower interconnection layer to the lower electrode; an upper interconnection layer; and an upper via plug connecting the upper interconnection layer to the upper electrode.

The lower interconnection layer and the upper interconnection layer may extend in different directions. The different directions may be perpendicular with each other.

The neuromorphic device may further include a sidewall spacer disposed on a side surface of the lower synapse layer, a side surface of the middle synapse layer, and a side surface of the upper synapse layer. The sidewall spacer may include an insulating material.

The lower electrode may be in contact with a first side surface of the lower synapse layer, a first side surface of the middle synapse layer, and a first side surface of the upper synapse layer. The upper electrode may be in contact with a second side surface of the lower synapse layer, a second side surface of the middle synapse layer, and a second side surface of the upper synapse layer.

The neuromorphic device may further include a sidewall disposed on an outer side surface of the lower electrode and an outer side surface of the upper electrode.

In an embodiment of present disclosure, a neuromorphic device may include a pre-synaptic neuron; a row line extending in a row direction from the pre-synaptic neuron; a post-synaptic neuron; a column line extending in a column direction from the post-synaptic neuron; and a synapse disposed at an intersection between the row line and the column line. The synapse may include a first synapse layer configured to change into a low resistance state when a first number of first pulses are applied to the synapse; a second synapse layer configured to change into a low resistance state when a second number of the first pulses are applied to the synapse, the second number of the first pulses being greater than the first number of the first pulses; and a third synapse layer being configured to change into a low resistance state when a third number of the first pulses are applied to the synapse, the third number of the first pulses being greater than the second number of the first pulses.

The first synapse layer may be configured to change into a high resistance state when a first number of second pulses are applied to the synapse. The second synapse layer may be configured to change into a high resistance state when a second number of the second pulses are applied to the synapse, the second number of the second pulses being smaller than the first number of the second pulses; and the third synapse layer may be configured to change into a high resistance state when a third number of the second pulses are applied to the synapse, the third number of the second pulses being smaller than the second number of the second pulses.

DETAILED DESCRIPTION

Figure 1A:
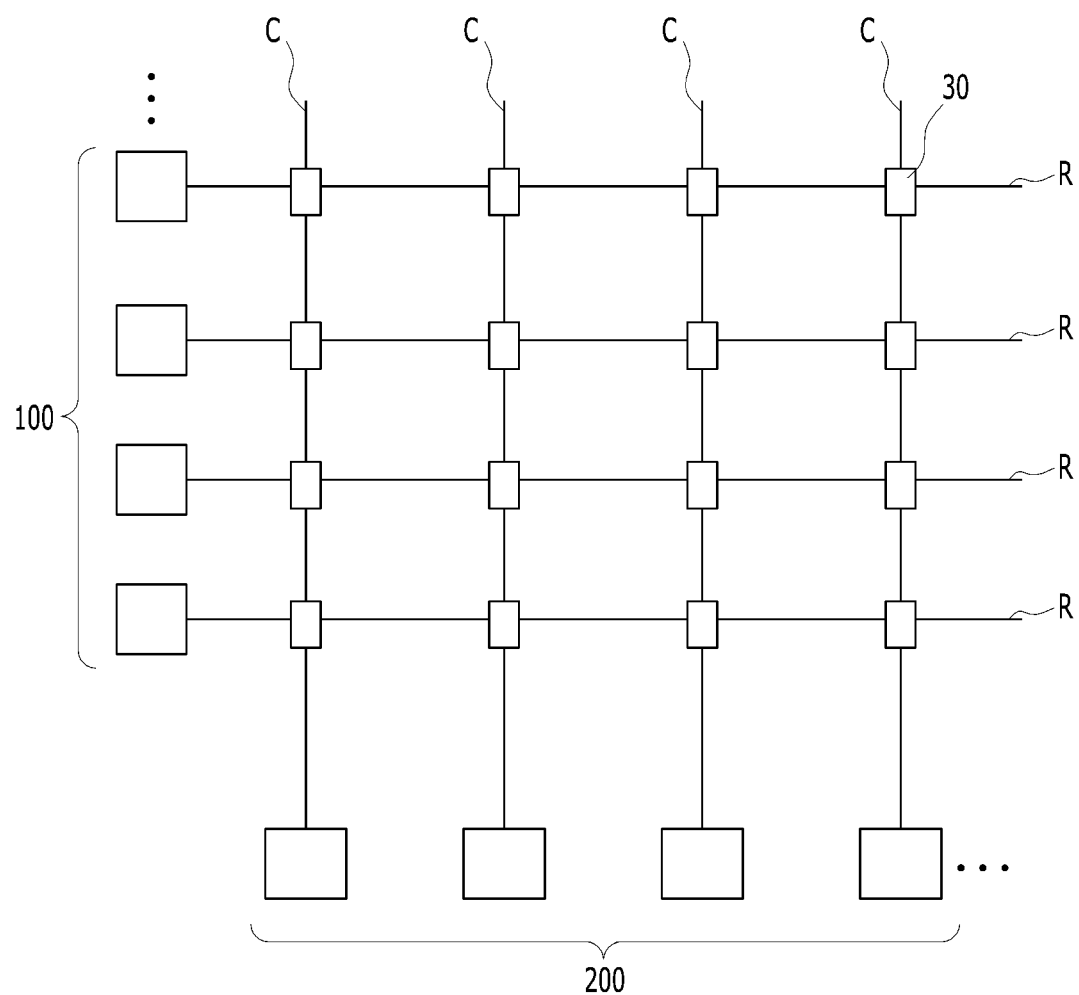
FIGS. 1A to 1D are diagrams schematically illustrating synapse arrays of neuromorphic devices in accordance with embodiments of the present disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will fully convey the scope of the claims to those skilled in the art.

Terms used in this specification are used to describe embodiments without limiting the present disclosure. The terms of a singular form may include plural forms unless referred to the contrary. The meaning of 'comprise' or 'comprising' used in the specification specifies a component, step, operation, and/or element, but does not exclude other components, steps, operations, and/or elements.

When one element is referred to as being 'connected with' or 'coupled with' another element, the former element may be directly connected or coupled with the latter element, or another element may be interposed therebetween. On the other hand, when one element is referred to as being 'directly connected with' or 'directly coupled with' another element, it may indicate that no element is interposed therebetween. In the present disclosure, 'and/or' may include each described item, or one or more combinations of the described items.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

In this specification, 'potentiating,' 'setting,' 'learning,' and 'training' may be used as the same or similar terms, and 'depressing,' 'resetting,' and 'initiating' may be used as the same or similar terms. For example, an operation of lowering the resistances of synapses may be exemplified as potentiating, setting, learning, or training, and an operation of raising the resistances of synapses may be exemplified as depressing, resetting, or initiating. Furthermore, when synapses are potentiated, set, or trained, a gradually increasing voltage/current may be outputted because the conductivities of the synapses are increased. On the other hand, when synapses are depressed, reset, or initiated, a gradually decreasing voltage/current may be outputted because the conductivities of the synapses are decreased. For convenience of description, the terms 'data pattern,' 'electrical signal,' 'pulse,' 'spike,' and 'fire' may have the same, a similar, or a compatible meaning. Furthermore, the terms 'voltage' and 'current' may also be interpreted as having the same or a compatible meaning.

FIGS. 1A to 1D are diagrams schematically illustrating synapse arrays of neuromorphic devices in accordance with embodiments of the present disclosure.

Referring to FIG. 1A, a synapse array of a neuromorphic device in accordance with an embodiment of the present disclosure may include a plurality of pre-synaptic neurons 100, a plurality of post-synaptic neurons 200, and a plurality of synapses 30. The synapses 30 may be disposed at intersections between row lines R extending from the pre-synaptic neurons 100 in a row direction, and column lines C extending from the post-synaptic neurons 200 in a column direction.

The pre-synaptic neurons 100 may provide or transmit electrical pulses to the synapses 30 through the row lines R in a learning mode, a reset mode, and a reading mode.

The post-synaptic neurons 200 may provide or transmit electrical pulses to the synapses 30 through the column lines C in the learning mode and the reset mode. The post-synaptic neurons 200 may receive electrical pulses through the column lines C.

Each of the synapses 30 may include a 2-electrode device, such as a variable resistor. For example, each of the synapses 30 may include a first electrode electrically connected with one of the pre-synaptic neurons 100 and a second electrode electrically connected with one of the post-synaptic neurons 200. The synapses 30 may have multiple resistance levels. The synapses 30 may gradually transit from/to a low resistance state to/from a high resistance state depending on numbers, times, and/or voltages of the electrical pulses applied to the synapses 30.

Figure 1B:
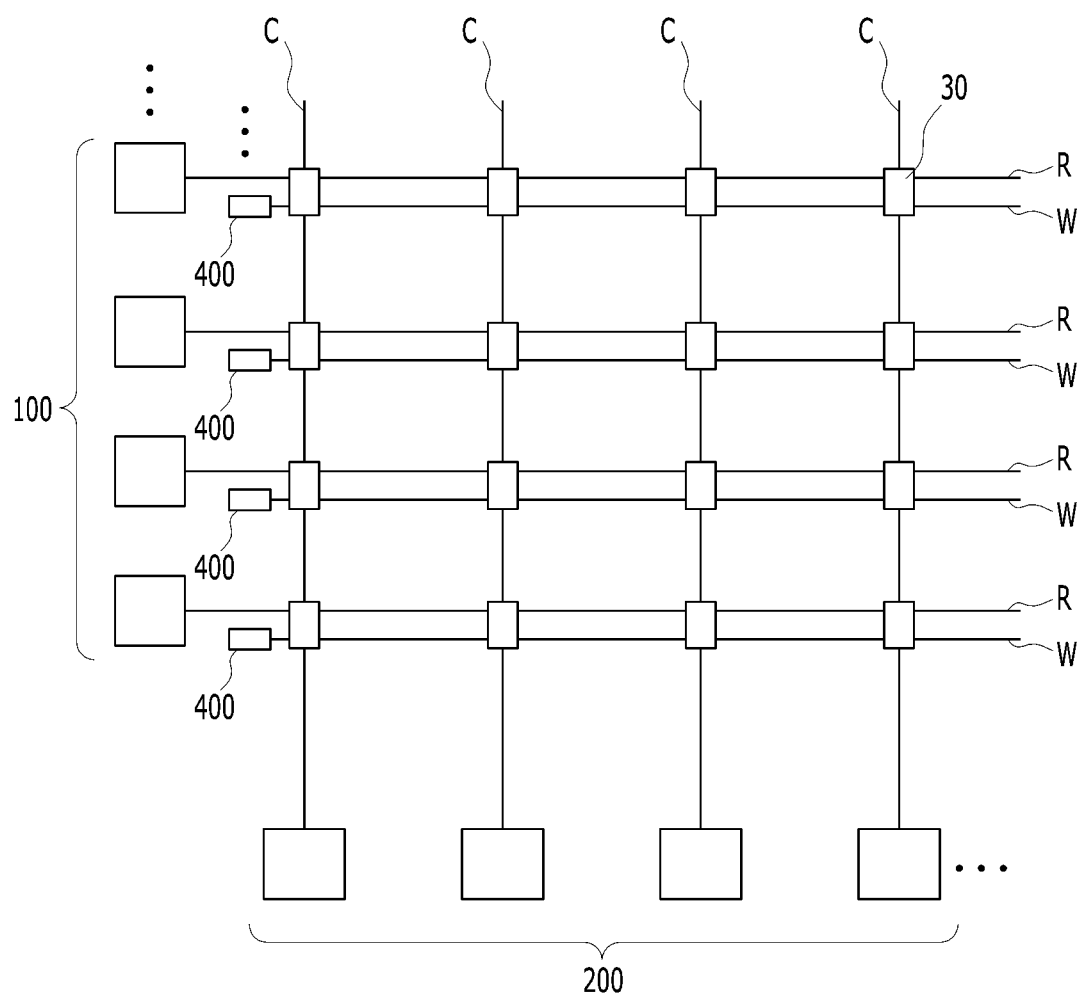

Referring to FIG. 1B, a synapse array of a neuromorphic device in accordance with an embodiment of the present disclosure may include a plurality of pre-synaptic neurons 100, a plurality of post-synaptic neurons 200, a plurality of synapses 30, and a plurality of selection circuits 400. The selection circuits 400 may be electrically connected with the synapses 30 through word lines W extending in parallel with row lines R that extend from the plurality of pre-synaptic neurons 100. Each of the synapses 30 may include a memristor and a transistor. The word lines W may be electrically connected with gate electrodes of the transistors, respectively. Drain electrodes of the transistors may be electrically connected with the row lines R, respectively. Source electrodes of the transistors may be electrically connected with first electrodes of the memristors, respectively. Second electrodes of the memristors may be electrically connected with column lines C extending from the plurality of post-synaptic neurons 200, respectively. The selection circuits 400 may control operations of the synapses 30 by turning the transistors on or off.

Figure 1C:
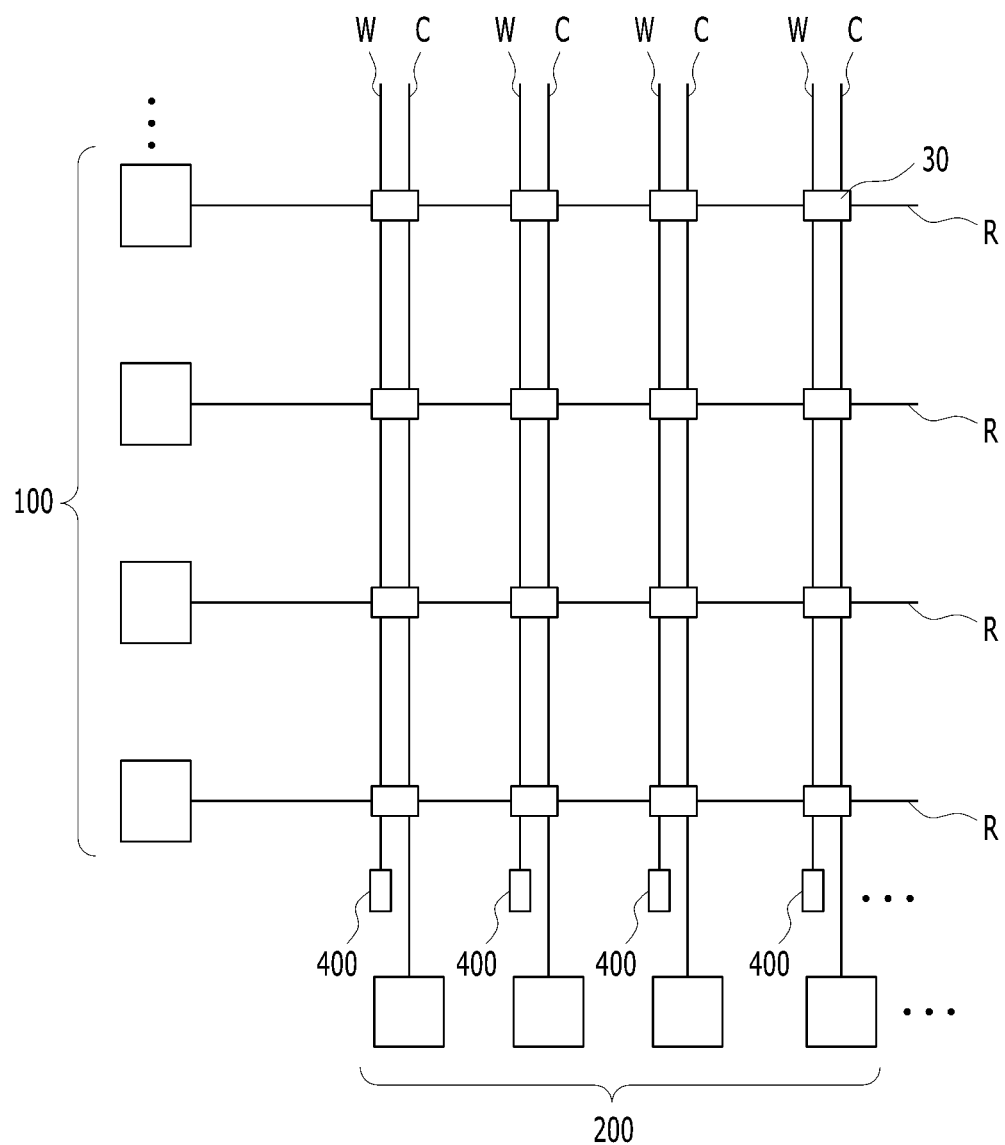

Referring to FIG. 1C, a synapse array of a neuromorphic device in accordance with an embodiment of the present disclosure may include a plurality of pre-synaptic neurons 100, a plurality of post-synaptic neurons 200, a plurality of synapses 30, and a plurality of selection circuits 400. The selection circuits 400 may be electrically connected with the synapses 30 through word lines W extending in parallel with column lines C that extend from the plurality of post-synaptic neurons 200. Each of the synapses 30 may include a memristor and a transistor, and each of the word lines W may be electrically connected with a gate electrode of one of the transistors. Drain electrodes of the transistors may be electrically connected with row lines R extending from the plurality of pre-synaptic neurons 100, respectively. Source electrodes of the transistors may be electrically connected with first electrodes of the memristors, respectively. Second electrodes of the memristors may be electrically connected with the column lines C.

Figure 1D:
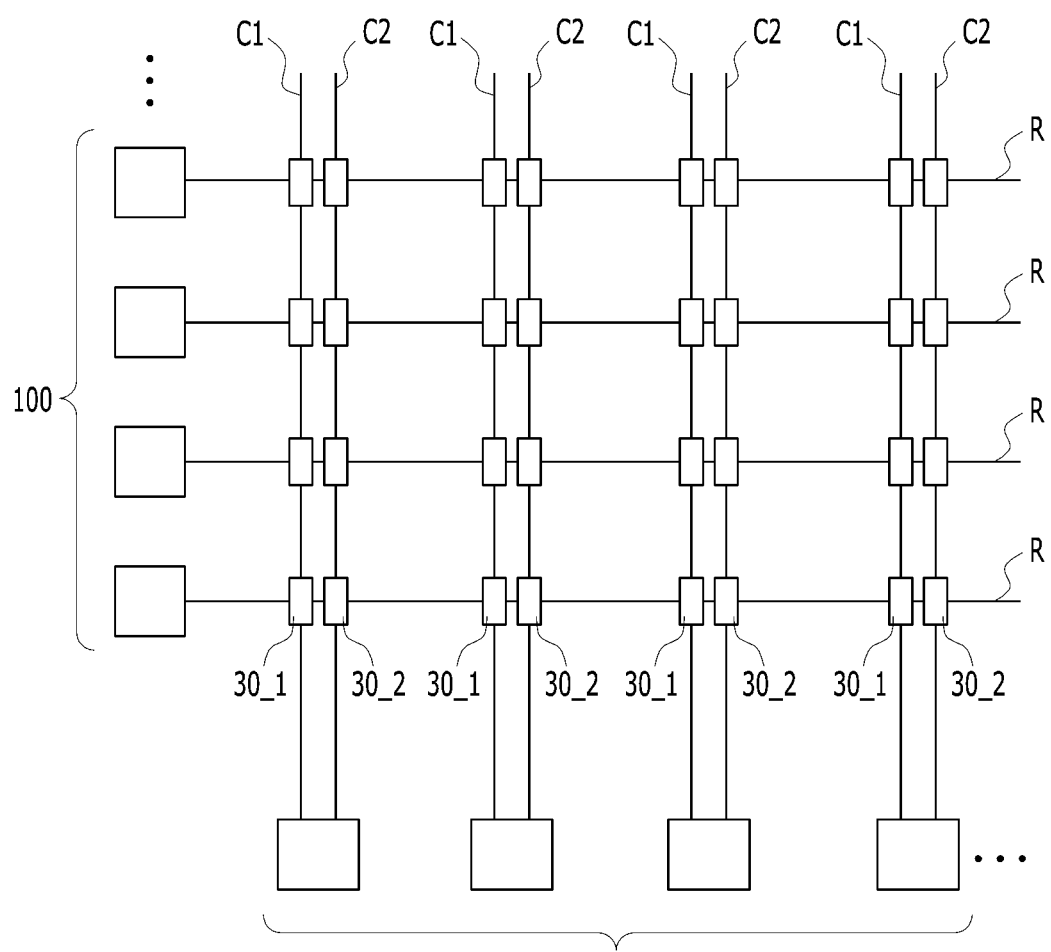

Referring to FIG. 1D, a synapse array of a neuromorphic device in accordance with an embodiment of the present disclosure may include a plurality of pre-synaptic neurons 100, a plurality of post-synaptic neurons 200, and a plurality of synapse pairs 30_1 and 30_2. Each of the synapse pairs 30_1 and 30_2 may be electrically connected with the same post-synaptic neuron 200. For example, first electrical signals from a first synapse 30_1 connected with a first column line C1 and second electrical signals from a second synapse 30_2 connected with a second column line C2 may be provided and input to the same post-synaptic neuron 200. Each of the post-synaptic neurons 200 may include an integrator. Accordingly, the first electrical signals may be input to a non-inverting input terminal of the integrator, and the second electrical signals may be input to an inverting input terminal of the integrator. Thus, the post-synaptic neuron 200 may be fired according to differences in charge accumulation between the first electrical signals and the second electrical signals.

FIGS. 2A to 2H are diagrams schematically illustrating neuromorphic devices in accordance with embodiments of the present disclosure.

Figure 2A:
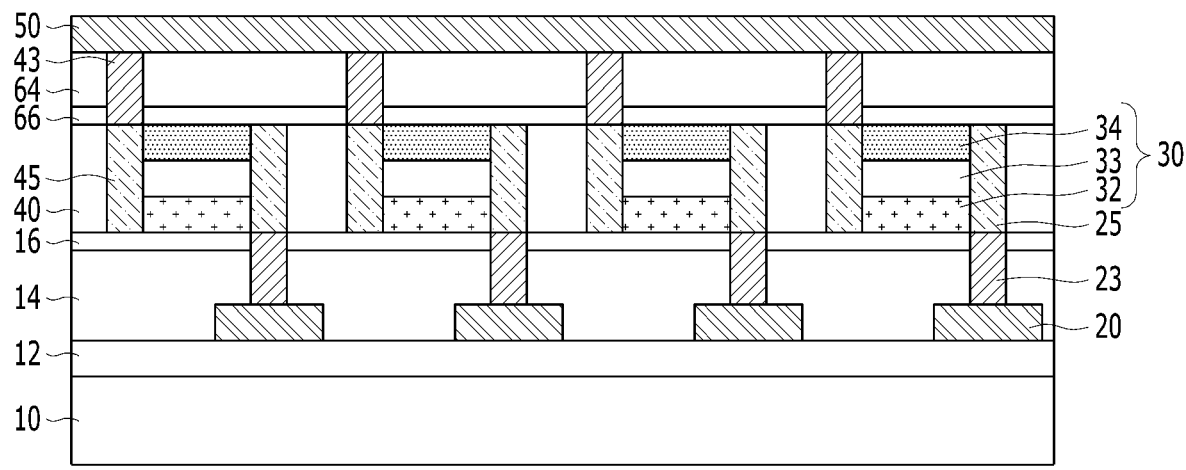
FIGS. 2A to 2H are diagrams schematically illustrating neuromorphic devices in accordance with embodiments of the present disclosure.

Referring FIG. 2A, a neuromorphic device in accordance with an embodiment of the present disclosure may include a surface insulating layer 12 disposed on a substrate 10, a lower interconnection layer 20, a lower interlayer insulating layer 14, a lower stopper layer 16, a lower via plug 23, a lower electrode 25, a synapse 30, an upper electrode 45, a middle interlayer insulating layer 40, an upper stopper layer 66, an upper interlayer insulating layer 64, an upper via plug 43, and an upper interconnection layer 50.

The substrate 10 may include at least one of a silicon-germanium wafer, an epitaxial grown layer, a ceramic layer, a glass layer, and another type of semiconductor substrate or insulating substrate.

The surface insulating layer 12 may be wholly formed on the substrate 10. The surface insulating layer 12 may include at least one of a silicon oxide, a silicon nitride, a silicon oxy-nitride, or and another insulating material.

The lower interconnection layer 20 may have a line shape extending in a first direction, e.g., a direction pointing out of the page. The lower interconnection layer 20 may include a conductor, such as a metal or a metal compound.

The lower interlayer insulating layer 14 may include at least one of a silicon oxide, a silicon nitride, a silicon oxy-nitride, and another insulating material.

The lower stopper layer 16 may include a material such as a silicon nitride or a silicon oxy-nitride, which is denser than the lower interlayer insulating layer 14.

The lower via plug 23 may penetrate the lower stopper layer 16 and the lower interlayer insulating layer 14 in a second direction, e.g., a vertical direction. The lower via plug 23 may electrically connect the lower interconnection layer 20 to the lower electrode 25. The lower via plug 23 may have a pillar shape. The lower via plug 23 may include a conductor, such as a metal or a metal compound.

The lower electrode 25 may have a panel shape or a block shape. The lower electrode 25 may be in contact with a first side surface of the synapse 30. The lower electrode 25 may include a conductor, such as a metal or a metal compound.

The synapse 30 may include at least three synapse layers 32 to 34 which are stacked. For example, the synapse 30 may include a lower synapse layer 32, a middle synapse layer 33, and an upper synapse layer 34. Accordingly, the lower electrode 25 may be in contact with first side surfaces of the stacked synapse layers 32 to 34. The synapse layers 32 to 34 may include carbon nano-tubes having various characteristics.

The upper electrode 45 may be shaped similarly to the lower electrode 25, and have a vertical panel shape or a block shape. The upper electrode 45 may be in contact with a second side surface of the synapse 30. That is, the upper electrode 45 may be in contact with second side surfaces of the stacked synapse layers 32 to 34. In the embodiment, the first side surface of the synapse 30 and the second side surface of the synapse 30 may be opposite to each other. The upper electrode 45 may include a conductor, such as a metal or a metal conductor.

The middle interlayer insulating layer 40 may be disposed between the lower electrode 25 in contact with a first synapse 30 and the upper electrode 45 in contact with a second synapse 30 that is adjacent to the first synapse 30. Thus, the middle interlayer insulating layer 40 may electrically insulate the lower electrode 25 and the upper electrode 45 connected to different synapses 30 from each other. The middle interlayer insulating layer 40 may include at least one of a silicon oxide, a silicon nitride, a silicon oxy-nitride, and another insulating material.

The upper stopper layer 66 may include a material that is denser than the upper interlayer insulating layer 64. For example, the upper stopper layer 66 may include silicon nitride.

The upper interlayer insulating layer 64 may include at least one of a silicon oxide, a silicon nitride, a silicon oxy-nitride, and another insulating material.

The upper via plug 43 may extend in the second direction and penetrate the upper interlayer insulating layer 64 and the upper stopper layer 66, and may electrically connect the upper interconnection layer 50 to the upper electrode 45. The upper via plug 43 may have a pillar shape. The upper via plug 43 may include a conductor, such as a metal or a metal compound.

The upper interconnection layer 50 may have a line shape extending in a third direction, e.g., a horizontal direction. For example, the upper interconnection layer 50 may horizontally extend perpendicularly to the lower interconnection layer 20. That is, the third direction may be perpendicular to the first direction. The upper interconnection layer 50 may include a conductor, such as a metal or a metal compound.

The lower interconnection layer 20 may be one of the row lines R illustrated in FIGS. 1A to 1D, and the upper interconnection layer 50 may be one of the column lines C illustrated in FIGS. 1A to 1D. In another embodiment, the lower interconnection layer 20 may be one of the column lines C, and the upper interconnection layer 50 may be one of the row lines C.

Figure 2B:
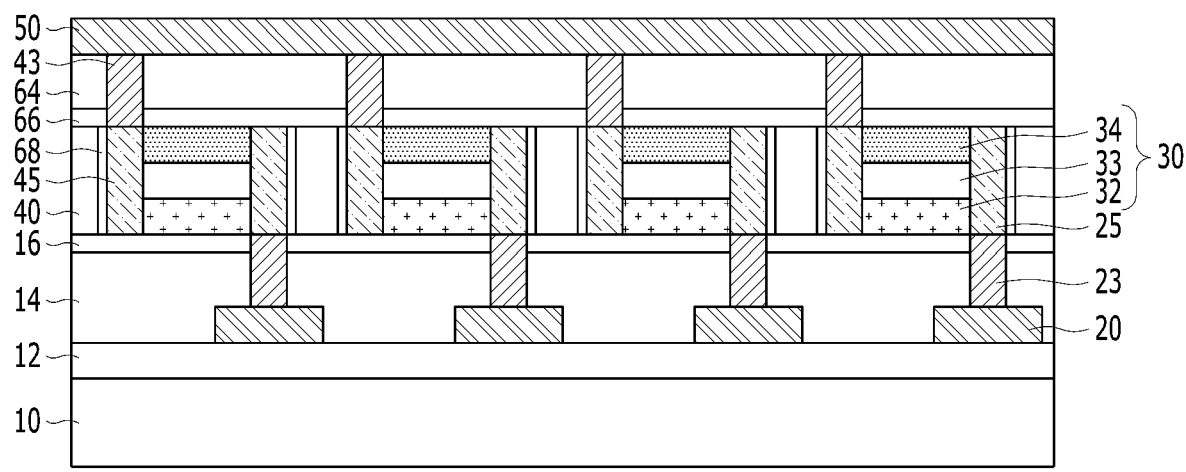

Referring to FIG. 2B, a neuromorphic device in accordance with an embodiment of the present disclosure may have different features than the neuromorphic device shown in FIG. 2A. The neuromorphic device illustrated in FIG. 2B further includes sidewall spacers 68 formed on outer side surfaces of a structure including the synapse 30, the lower electrode 25, and the upper electrode 45. The sidewall spacers 68 may protect the synapse 30, the lower electrode 25, and the upper electrode 45 from being chemically and/or physically degraded by external sources.

Figure 2C:
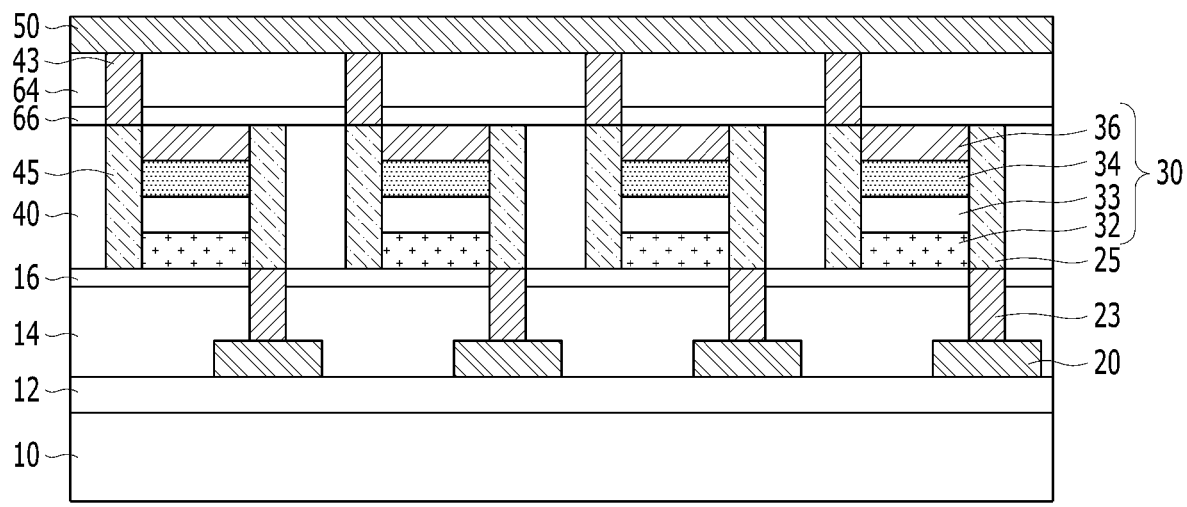

Referring to FIG. 2C, a neuromorphic device in accordance with the embodiment of the present disclosure, may also have different features than the neuromorphic device shown in FIG. 2A. The neuromorphic device illustrated in FIG. 2C further includes a capping layer 36 disposed on the upper synapse layer 34.

Figure 2D:
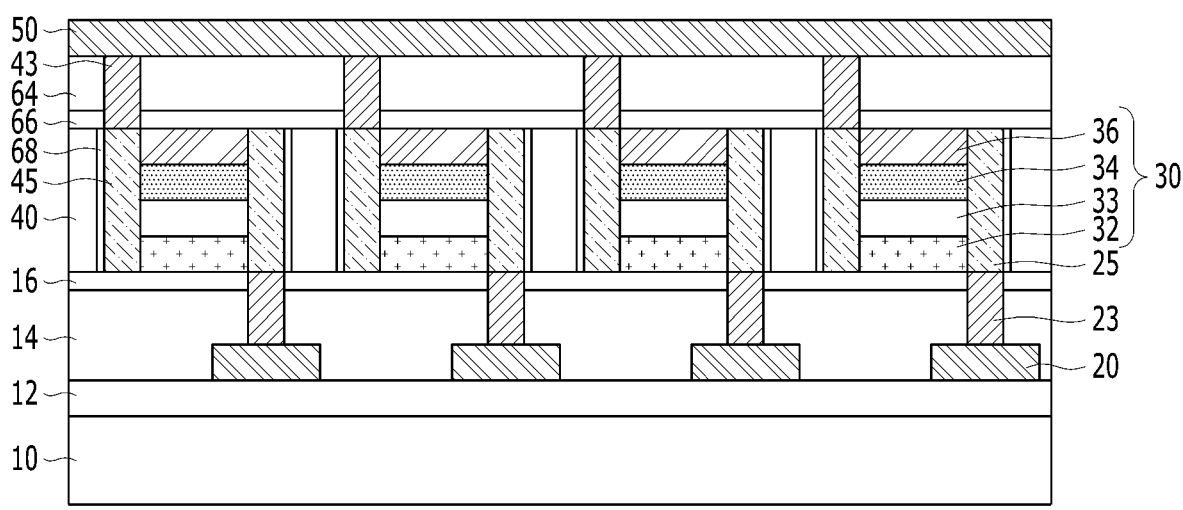

Referring to FIG. 2D, a neuromorphic device in accordance with the embodiment of the present disclosure, may further include both of the capping layer 36 shown in FIG. 2C and the sidewall spacers 68 shown in FIG. 2B in comparison with the neuromorphic device shown in FIG. 2C.

Figure 2E:
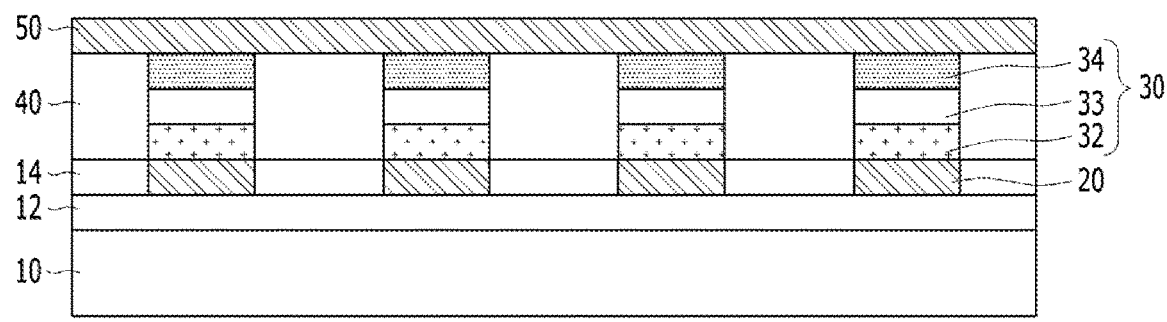

Referring to FIG. 2E, a neuromorphic device in accordance with an embodiment of the present disclosure may include a surface insulating layer 12 disposed on a substrate 10, lower interconnection layers 20 disposed on the surface insulating layer 12, synapses 30 disposed on the lower interconnection layers 20, an interlayer insulating layer 40 disposed between the synapses 30, and an upper interconnection layer 50 disposed on the synapses 30 and the interlayer insulating layer 40. The lower interconnection layers 20 may have line shapes extending in a first direction, e.g., a direction pointing out of the page. The synapses 30 may be arrayed in a matrix of latticed islands along a plane crossing a second direction, e.g., a vertical direction. The upper interconnection layer 50 may have a line shape extending in a third direction, e.g., a horizontal direction. The lower interconnection layers 20 and the upper interconnection layer 50 may be perpendicular to each other. That is, the first direction and the third direction may be perpendicular to each other. The synapses 30 may each include at least three synapse layers 32 to 34, which are stacked. For example, each synapse 30 may include a lower synapse layer 32, a middle synapse layer 33, and an upper synapse layer 34. The lower interconnection layers 20 may be electrically connected with the lower synapses 32 of the synapses 30, respectively. The upper interconnection layer 50 may be electrically connected with each of the upper synapse layers 34 of the synapses 30. In contrast to the neuromorphic devices shown in FIGS. 2A to 2D, the neuromorphic device shown in FIG. 2E may omit the lower via plug 23, the lower electrode 25, the upper electrode 45, and the upper via plug 43.

Figure 2F:
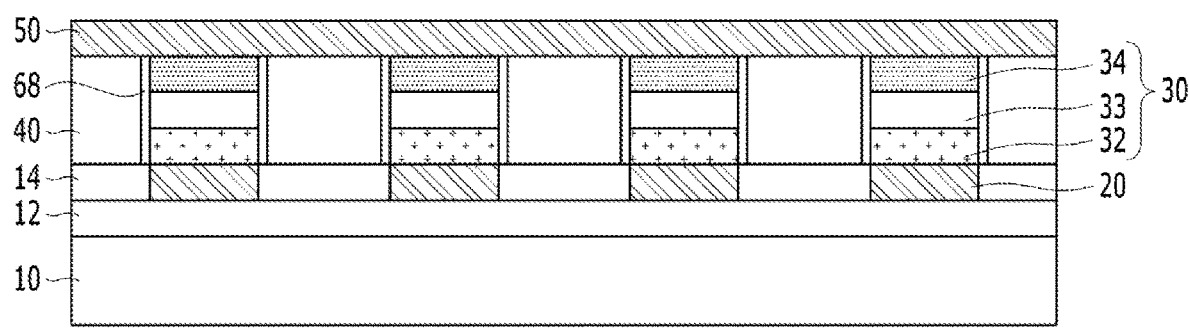

A neuromorphic device illustrated in FIG. 2F may have different features than the neuromorphic device shown in FIG. 2E. Specifically, the neuromorphic device illustrated in FIG. 2F may further include sidewall spaces 68 formed on side surfaces of the synapses 30.

Figure 2G:
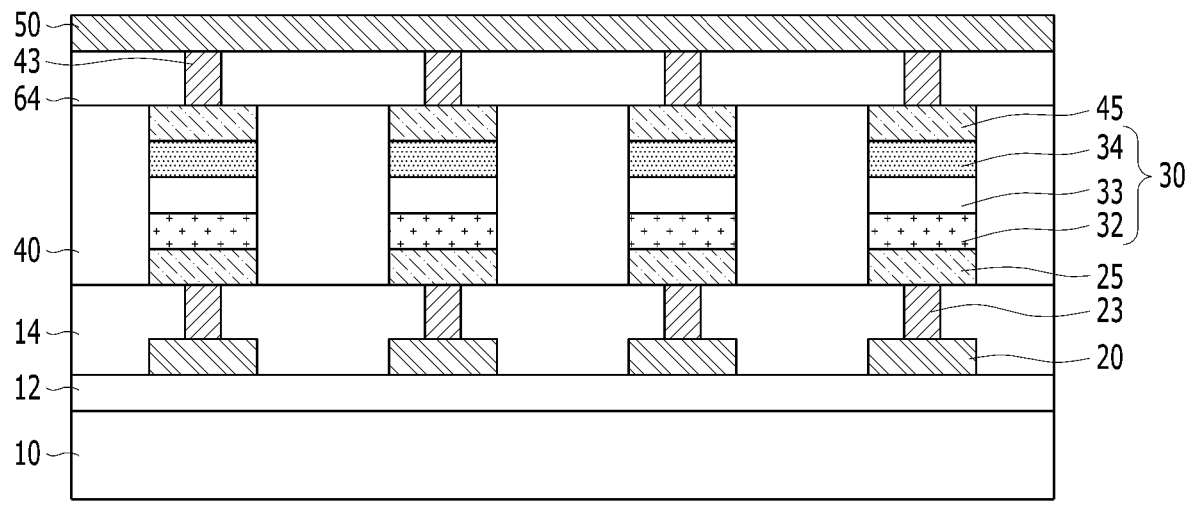

Referring to FIG. 2G, a neuromorphic device in accordance with an embodiment of the present disclosure may be different from the neuromorphic device illustrated in FIG. 2A. Specifically, the neuromorphic device illustrated in FIG. 2G includes a stack including a lower electrode 25, synapse layers 32 to 34 of a synapse 30 stacked on the lower electrode 25, and an upper electrode 45 stacked on the synapse 30. Each of the lower electrode 25 and the upper electrode 45 may have a plate shape or a mesa shape.

Figure 2H:
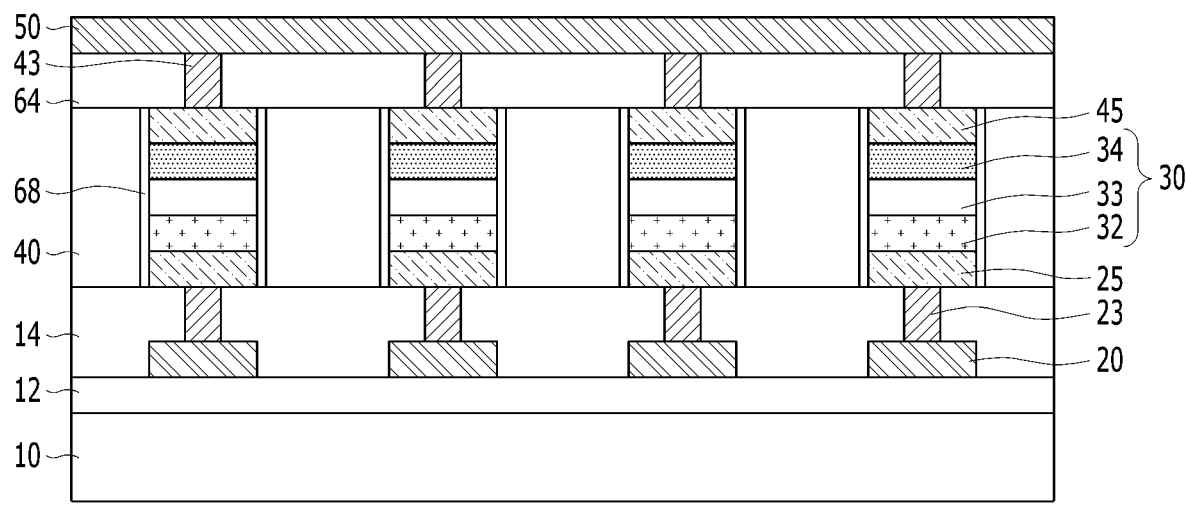

Referring to FIG. 2H, a neuromorphic device in accordance with an embodiment of the present disclosure may be similar to the neuromorphic device illustrated in FIG. 2G, but further include sidewall spaces 68 on a side surface of the stack including the lower electrode 25, the synapse layers 32 to 34 of the synapse 30, and the upper electrode 45.

FIGS. 3A to 3E are schematic longitudinal sectional views illustrating synapses in accordance with embodiments of the present disclosure.

Figure 3A:
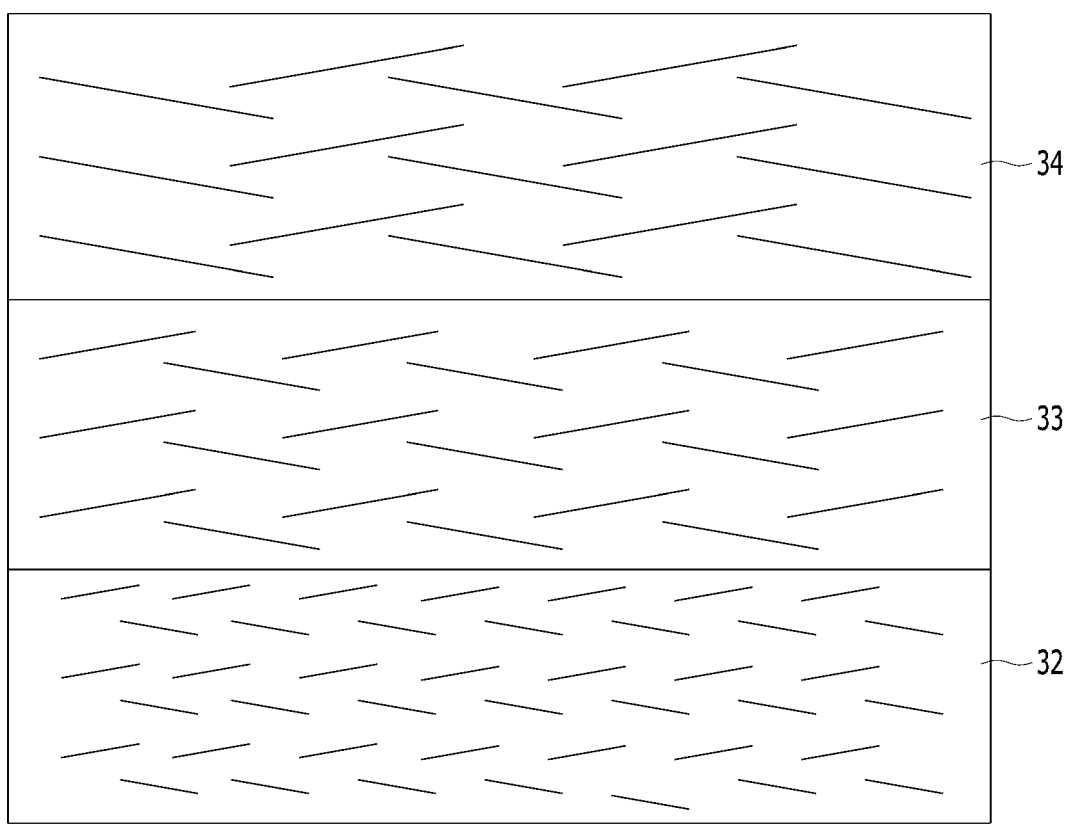
FIGS. 3A to 3F are schematic longitudinal sectional views illustrating synapses in accordance with embodiments of the present disclosure.

Referring to FIG. 3A, a synapse 30A in accordance with an embodiment of the present disclosure may include a lower synapse layer 32, a middle synapse layer 33 disposed on the lower synapse layer, and an upper synapse layer 34 disposed on the middle synapse layer 33. The lower synapse layer 32, the middle synapse layer 33, and the upper synapse layer 34 may each include carbon nano-tubes.

The lower synapse layer 32 may include first carbon nano-tubes having first lengths, which, on average, are relatively short lengths. For example, the first carbon nano-tubes may have lengths in a range of about 20 to 80 nanometers.

The middle synapse layer 33 may include second carbon nano-tubes having second lengths, which, on average, are relatively intermediate lengths. For example, the second carbon nano-tubes may have lengths in a range of about 100 to 200 nanometers.

The upper synapse layer 34 may include third carbon nano-tubes having third lengths, which, on average, may be relatively long lengths. For example, the third carbon nano-tubes may have lengths in a range of about 300 to 500 nanometers.

The first to third carbon nano-tubes may be randomly and freely distributed in respective layers of the synapse 30A. However, embodiments of the present disclosure are not limited to the depiction shown in FIG. 3A. In the embodiment illustrated in FIG. 3A, the first to third lengths of the first to third carbon nano-tubes are depicted, but embodiments are not limited thereto. Accordingly, the present disclosure is not limited to the aforementioned ranges. In some embodiments of the present disclosure, the stacked synapse layers 32 to 34 can be compatibly stacked with each other. For example, the layers 32 to 34, which include the first to third carbon nano-tubes having the shortest to longest lengths, respectively, may be stacked in a different order than the order illustrated in FIG. 3A.

Figure 3B:
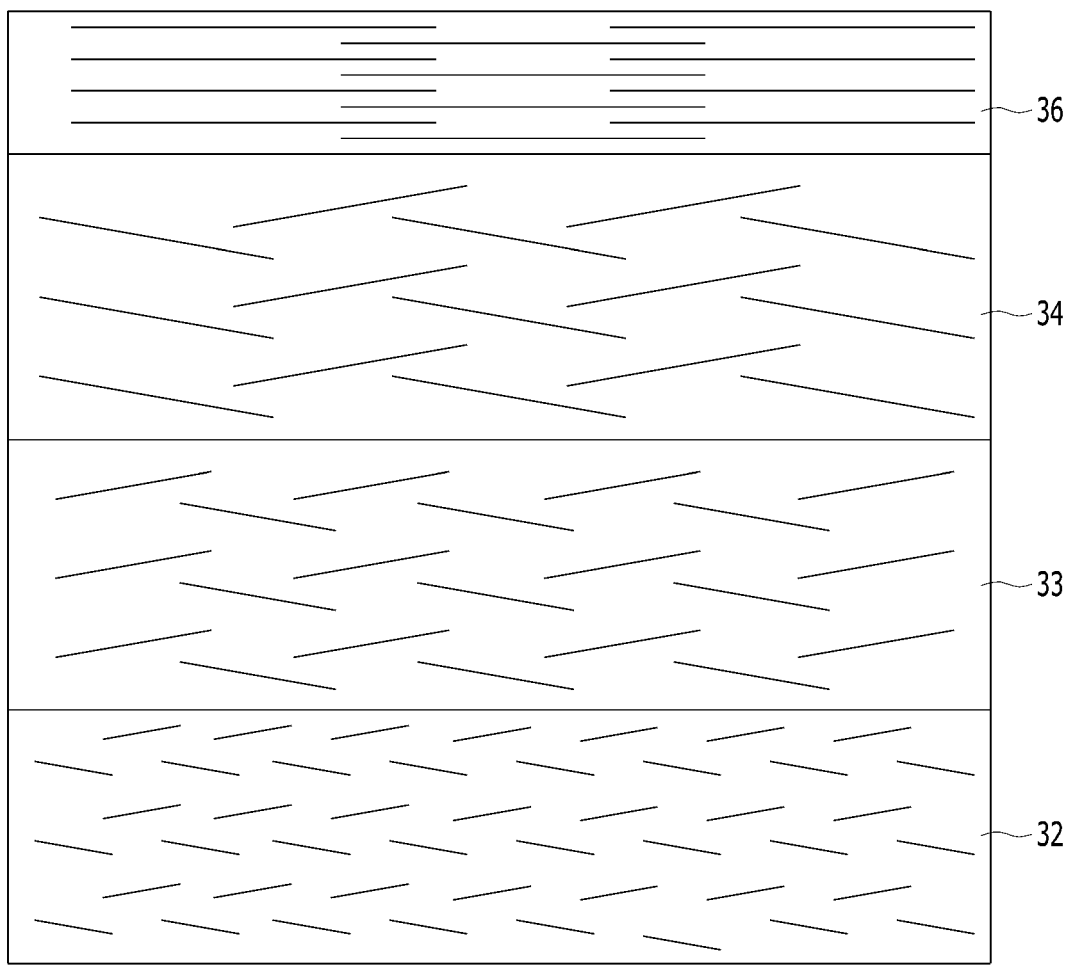

Referring to FIG. 3B, a synapse 30B in accordance with an embodiment of the present disclosure may have a similar structure to the synapse 30A shown in FIG. 3A, and may further include a capping layer 36 disposed on the upper synapse layer 34. The capping layer 36 may include carbon nano-tubes that are densely arranged, and that extend along approximately the same direction, e.g., a horizontal direction. That is, the carbon nano-tubes in the capping layer 36 may be horizontal carbon nano-tubes. Since the horizontal carbon nano-tubes in the capping layer 36 may be horizontally and densely arranged in the capping layer 36, the spatial orientation of the horizontal carbon nano-tubes can be substantially maintained when electrical signals are applied to the synapse 30B. That is, a conductance of the capping layer 36 is substantially constant when the electrical signals are applied. The horizontal carbon nano-tubes in the capping layer 36 may be longer than the third carbon nano-tubes in the upper synapse layer 34. The capping layer 36 can protect the synapse layers 32 to 34 from being chemically and/or physically degraded by external sources.

Figure 3C:
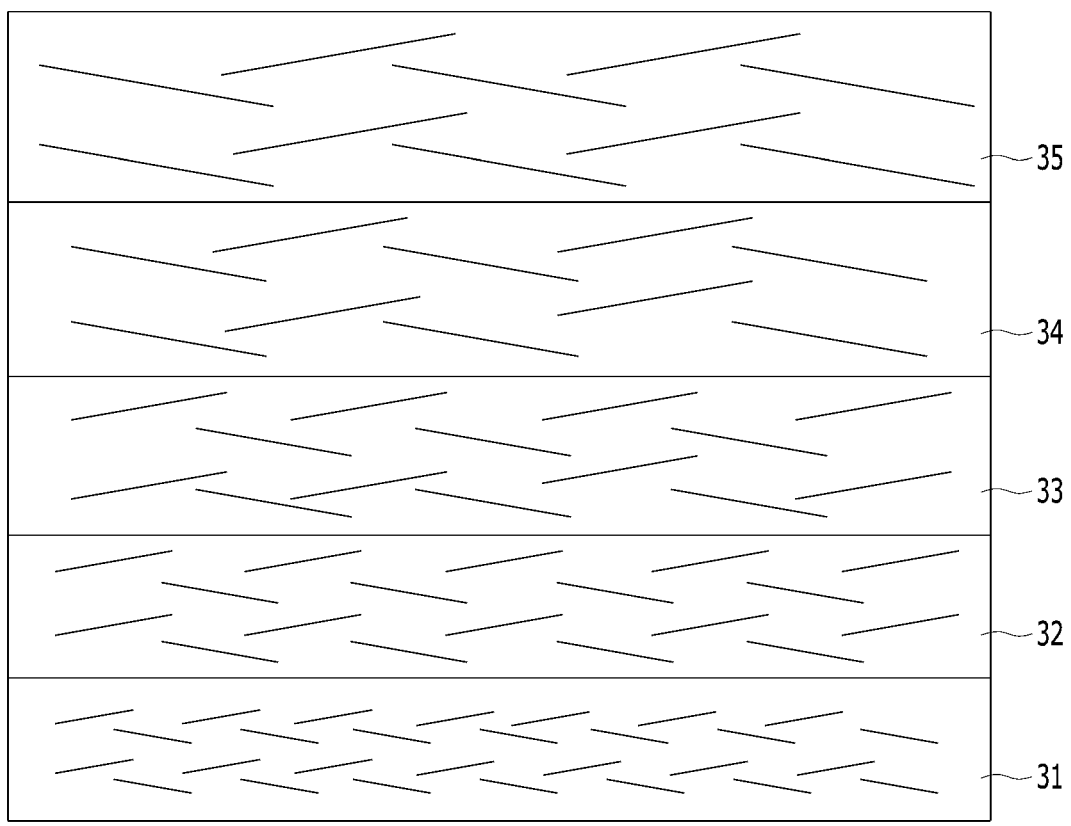

Referring to FIG. 3C, a synapse 30C in accordance with an embodiment of the present disclosure may include a bottom synapse layer 31, a lower synapse layer 32 disposed on the bottom synapse layer 31, a middle synapse layer 33 disposed on the lower synapse layer 32, an upper synapse layer 34 disposed on the middle synapse layer 33, and a top synapse layer 35 disposed on the upper synapse layer 34. The bottom synapse layer 31 may include first carbon nano-tubes having first lengths, the lower synapse layer 32 may include second carbon nano-tubes having second lengths, the middle synapse layer 33 may include third carbon nano-tubes having third lengths, the upper synapse layer 34 may include fourth carbon nano-tubes having fourth lengths, and the top synapse layer 35 may include fifth carbon nano-tubes having fifth lengths. The first lengths may be the shortest lengths among the first to fifth lengths, the second lengths may be longer than the first lengths and shorter than the third lengths, the third lengths may be longer than the second lengths and shorter than the fourth lengths, the fourth lengths may be longer than the third lengths and shorter than the fifth lengths, and the fifth lengths may be the longest lengths among the first to fifth lengths. For example, the first lengths may be shorter than about 50 nanometers, the second lengths may be in a range of about 60 to 100 nanometers, the third lengths may be in a range of about 110 to 200 nanometers, the fourth lengths may be in a range of about 210 to 300 nanometers, and the fifth lengths may be longer than about 310 nanometers. However, the present disclosure is not limited to the aforementioned ranges. In some embodiments of the present disclosure, the synapse 30C shown in FIG. 3C may further include the capping layer 36 shown in FIG. 3B, e.g., on the top synapse layer 35.

Figure 3D:
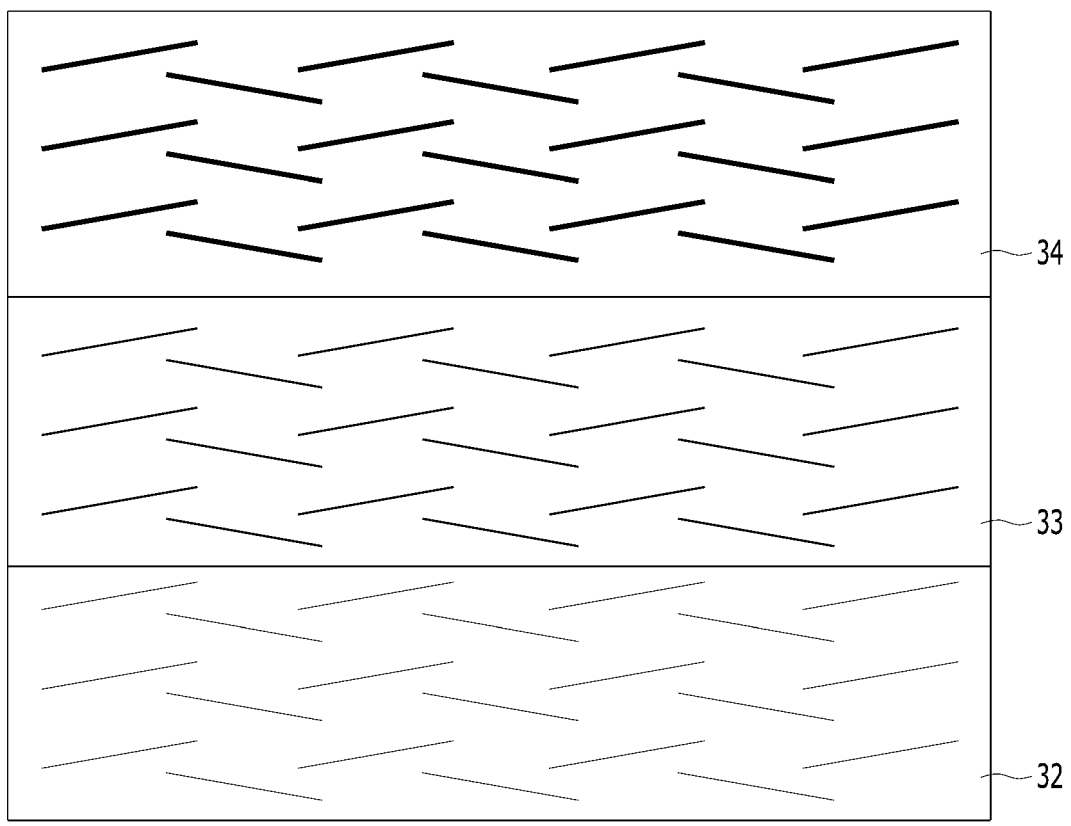

Referring to FIG. 3D, a synapse 30D in accordance with an embodiment of the present disclosure may include a lower synapse layer 32, a middle synapse layer 33 disposed on the lower synapse layer 32, and an upper synapse layer 34 disposed on the middle synapse layer 33. The lower synapse layer 32 may include first carbon nano-tubes having first diameters, the middle synapse layer 33 may include second carbon nano-tubes having second diameters, and the upper synapse layer 34 may include third carbon nano-tubes having third diameters. On average, the first diameters may be the smallest among the first to third diameters, the second diameters may be larger than the first diameters and smaller than the third diameters, and the third diameters may be the largest among the first to third diameters. For example, the first diameters may be in a range of about 3 to 5 nanometers, the second diameters may be in a range of about 6 to 15 nanometers, and the third diameters may be in a range of about 16 to 30 nanometers. However, the present disclosure is not limited to the aforementioned ranges. In some embodiments of the present disclosure, the stacked synapse layers 32 to 34 can be compatibly stacked with each other. For example, the layers 32 to 34, which include the first to third carbon nano-tubes having the smallest to largest diameters, respectively, may be stacked in a different order than the order illustrated in FIG. 3D.

In some embodiments of the present disclosure, the synapse 30D shown in FIG. 3D may further include the capping layer 36 shown in FIG. 3B, e.g., on the upper synapse layer 34.

Figure 3E:
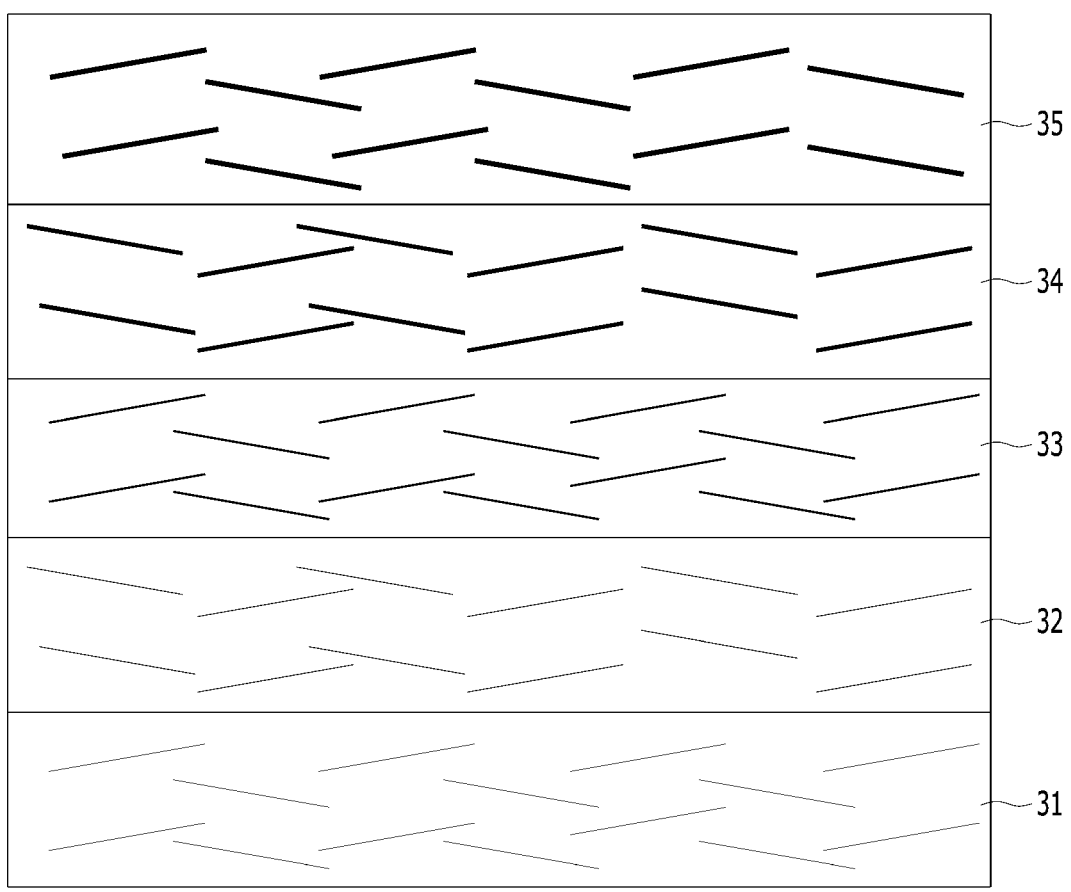

Referring to FIG. 3E, a synapse 30E in accordance with an embodiment of the present disclosure may include synapse layers 31 to 35, which are sequentially stacked. For example, the synapse 30E may include a bottom synapse layer 31, a lower synapse layer 32 disposed on the bottom synapse layer 31, a middle synapse layer 33 disposed on the lower synapse layer 32, an upper synapse layer 34 disposed on the middle synapse layer 33, and a top synapse layer 35 disposed on the upper synapse layer 34. Further referring to FIG. 3E, the synapse layers 31 to 35 may include carbon nano-tubes having various diameters different from one another. For example, the bottom synapse layer 31 may include first carbon nano-tubes having first diameters, the lower synapse layer 32 may include second carbon nano-tubes having second diameters, the middle synapse layer 33 may include third carbon nano-tubes having third diameters, the upper synapse layer 34 may include fourth carbon nano-tubes having fourth diameters, and the top synapse layer 35 may include fifth carbon nano-tubes having fifth diameters. The first diameters may be the smallest diameters among the first to fifth diameters, the second diameters may be larger than the first diameters and smaller than the third diameters, the third diameters may be larger than the second diameters and smaller than the fourth diameters, the fourth diameters may be larger than the third diameters and smaller than the fifth diameters, and the fifth diameters may be the largest diameters among the first to fifth diameters. For example, the first diameters may be smaller than about 5 nanometers, the second diameters may be in a range of about 6 to 8 nanometers, the third diameters may be in a range of about 9 to 15 nanometers, the fourth diameters may be in a range of about 16 to 25 nanometers, and the fifth diameters may be larger than about 26 nanometers. However, embodiments of the present disclosure are not limited to the aforementioned ranges. In some embodiments of the present disclosure, the synapse 30E shown in FIG. 3E may further include the capping layer 36 shown in FIG. 3B, e.g., on the top synapse layer 35.

In some embodiments of the present disclosure, the synapse layers 31 to 35 may include various different carbon nano-tubes. For example, the carbon nano-tubes may include at least one of single-wall nano-tubes, double-wall nano-tubes, multi-wall nano-tubes, rope nano-tubes, and combinations thereof. Accordingly, the synapse layers 31 to 35 may include various carbon nano-tubes substantially different from one another. For example, the lower synapse layer 32 may include a relatively high ratio of the single-wall nano-tubes, the middle synapse layer 33 may include a relatively high ratio of the double-wall nano-tubes, and the upper synapse layer 34 may include a relatively high ratio of the multi-wall nano-tubes.

Figure 3F:
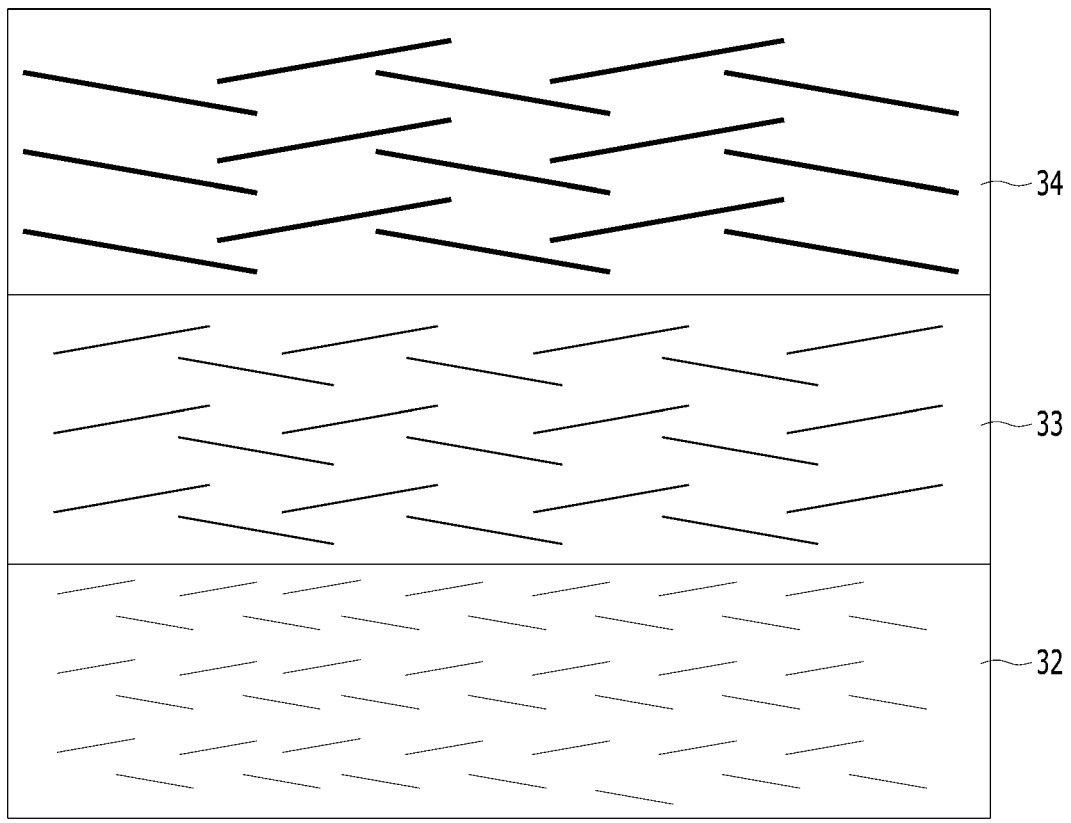

Referring to FIG. 3F, a synapse 30F in accordance with an embodiment of the present disclosure may include a lower synapse layer 32, a middle synapse layer 33, and an upper synapse layer 34. The lower synapse layer 32 may include first carbon nano-tubes having first lengths, first diameters, and/or single-wall structures; the middle synapse layer 33 may include second carbon nano-tubes having second lengths, second diameters, and/or double-wall structures; and the upper synapse layer 34 may include third carbon nano-tubes having third lengths, third diameters, and/or multi-wall structures. Although not explicitly shown, the technical features of the synapses 30A and 30D shown in FIGS. 3A and 3D can be variously combined.

FIGS. 4A to 4D are diagrams illustrating conductance changes of a synapse 30 in accordance with an embodiment of the present disclosure. Embodiments of carbon nano-tubes are schematically illustrated in FIGS. 4A to 4D and described with reference to FIG. 3F, but embodiments of the present disclosure are not limited to the depictions in FIGS. 4A to 4D and 3F.

Figure 4A:
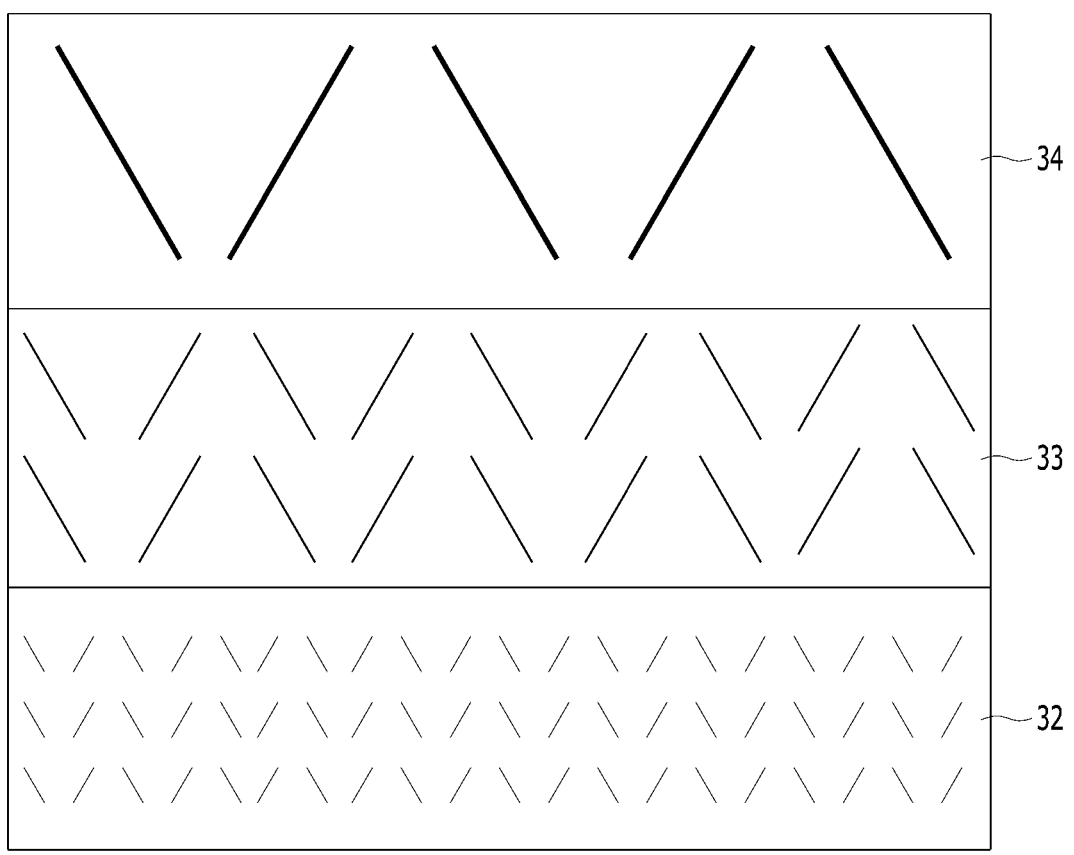
FIGS. 4A to 4D are diagrams illustrating conductance changes of a synapse in accordance with an embodiment of the present disclosure.

At first, referring to FIG. 4A, the synapse 30 may be in a basic state or an initial state, e.g., the highest among a plurality of resistance states. In the basic state, carbon nano-tubes included in lower, middle, and upper synapse layers 32, 33, and 34 of the synapse 30 may be independently arrayed, such that the carbon nano-tubes are not connected with each other. That is, the carbon nano-tubes are not in contact with each other. In other words, the carbon nano-tubes may be separated from each other when the synapse 30 is in the basic state.

Figure 4B:
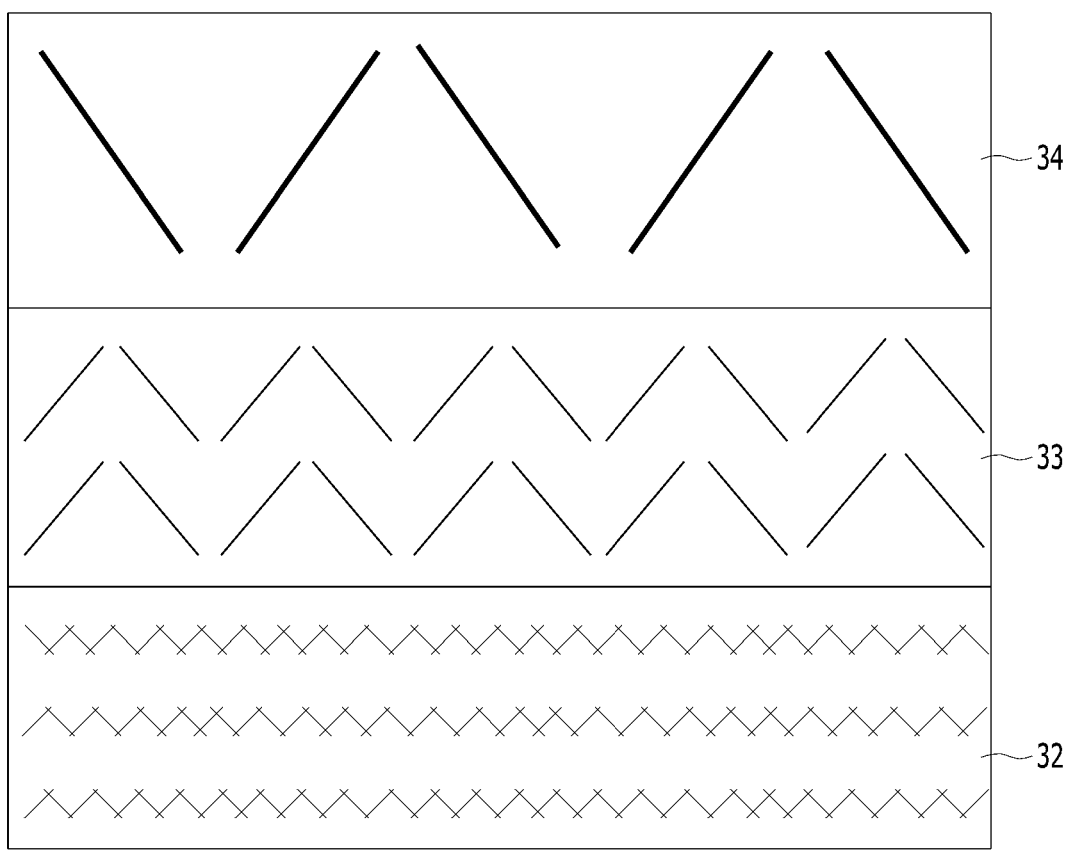

Referring to FIG. 4B, in a first resistance state, e.g., a relatively high resistance state among the plurality of resistance states, first carbon nano-tubes in the lower synapse layer 32 may be connected with each other in the form of bridges, and each of the second carbon nano-tubes in the middle synapse layer 33 and the third carbon nano-tubes in the upper synapse layer 34 may be separated from each other. However, distances between each of the second carbon nano-tubes and the third carbon nano-tubes may be shorter when the synapse 30 is in the first resistance state than when the synapse 30 is in the basic state. That is, each of the second carbon nano-tubes and the third carbon nano-tubes may be closer to each other. The synapse 30 may be set in the first resistance state when a plurality of electrical pulses are applied to the synapse layers 32 to 34 from a lower electrode 25. As the pulses are applied, the first carbon nano-tubes, i.e., the shortest carbon nano-tubes, in the lower synapse layer 32 may be connected with each other before carbon nano-tubes in the other layers 33 and 34. The first carbon nano-tubes in the lower synapse layer 32 may be the first nano-tubes to respond to the electrical pulses, because the first carbon nano-tubes are the lightest among the carbon nano-tubes in the synapse 30.

Figure 4C:
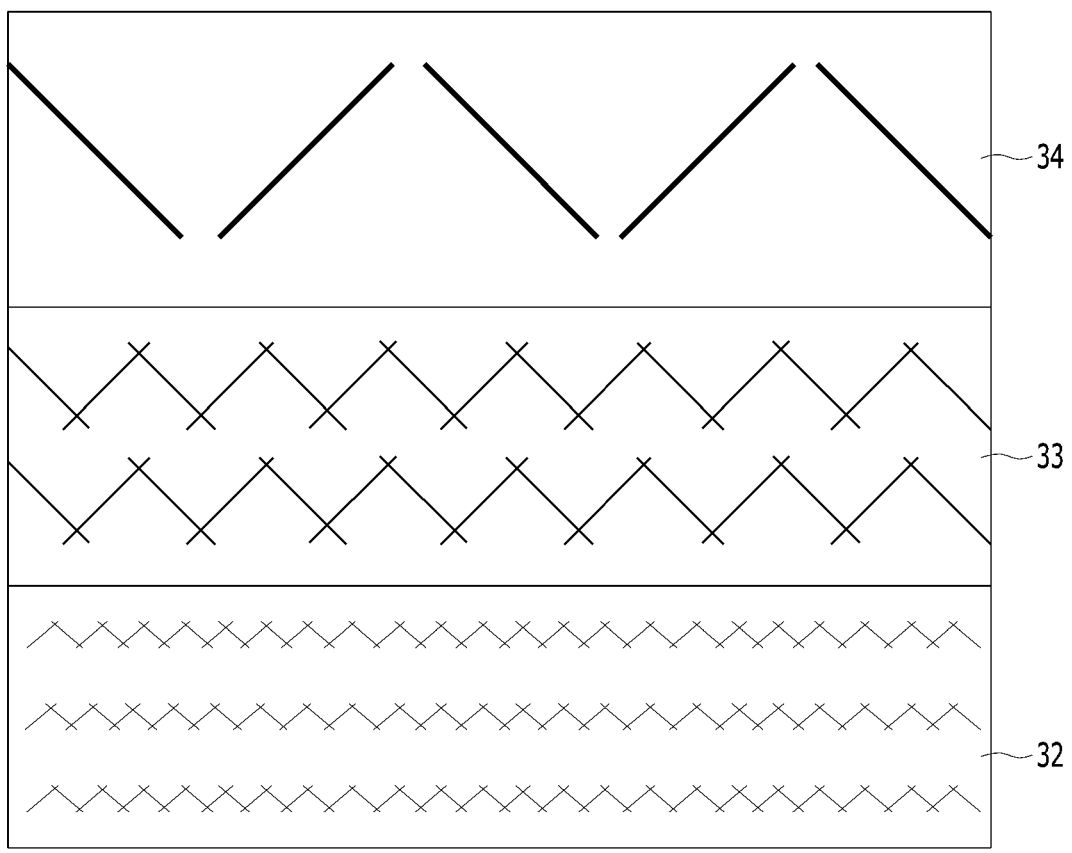

Referring to FIG. 4C, in a second resistance state, e.g., a middle resistance state, each of the first carbon nano-tubes in the lower synapse layer 32 and the second carbon nano-tubes in the middle synapse layer 33 may be connected with each other in the form of bridges, and the third carbon nano-tubes in the upper synapse layer 34 may be separated from each other. However, distances between the third carbon nano-tubes may be shorter when the synapse 30 is in the second resistance state than when the synapse 30 is in the first resistance state. That is, the third carbon nano-tubes in the upper synapse layer 34 may be closer to each other. Specifically, when the plurality of pulses continue to be applied to the synapse layers 32 to 34 from the lower electrode 25, the synapse 30 is set in the second resistance state and the second carbon nano-tubes, i.e., the carbon nano-tubes with the intermediate lengths, in the middle synapse layer 33 may also be connected with each other.

Figure 4D:
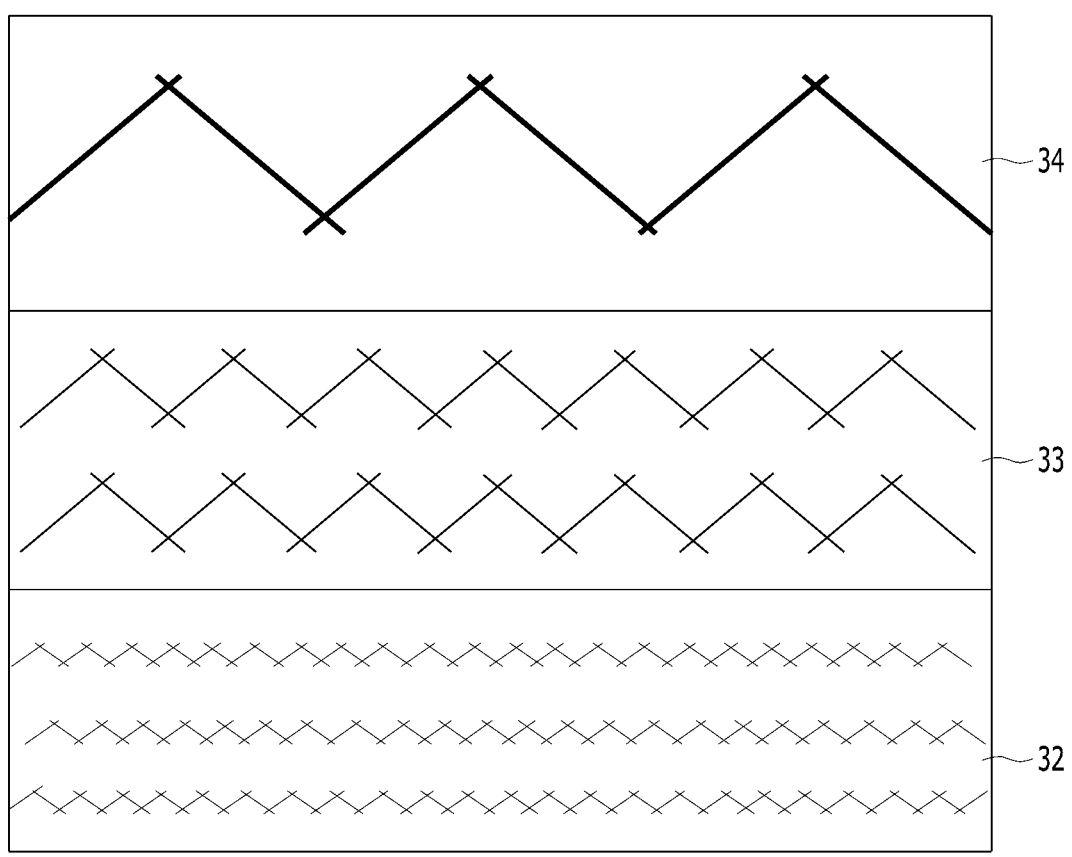

Referring FIG. 4D, in a third resistance state, e.g., the lowest resistance state among the plurality of resistance states, the carbon nano-tubes in each of the synapse layers 32 to 34 may be connected with each other in the form of bridges. For example, when the plurality of electrical pulses continue to be applied to the synapse layers 32 to 34 from the lower electrode 25, the third carbon nano-tubes, i.e., the longest carbon nano-tubes among the nano-tubes in the synapse 30, in the upper synapse layer 34 may also be connected with each other.

Specifically, when first electrical signals having a first polarity are applied to the synapse 30 through the lower electrode 25, the most sensitive carbon nano-tubes may be connected with each other by the attraction force of electro static discharge (ESD). The first electrical signals may be, for example, a plurality of positive (+) pulses. When the carbon nano-tubes connect to each other, resistances of the synapse layers 32 to 34 may be lowered and conductivities of the synapse layers 32 to 34 may be raised. Furthermore, when second electrical signals having a second polarity, which is opposite to the first polarity, are applied to the synapse 30 through an upper electrode 45, the most sensitive carbon nano-tubes may be released or disconnected from each other by the repulsion force of electro static discharge (ESD). The second electrical signals may be, for example, a plurality of negative (−) pulses. That is, resistances of the synapse layers 32 to 34 may be raised and conductivities of the synapse layers 32 to 34 may be lowered.

Generally, the carbon nano-tubes that are relatively sensitive to the attraction force may be relatively insensitive to the repulsion force, and the carbon nano-tubes that are relatively sensitive to the repulsion force may be relatively insensitive to the attraction force.

In the embodiments of the present disclosure, a total resistance and a total conductance of the synapse 30 can be stably and gradually changed. Specifically, the total resistance of the synapse 30 can gradually change from a high resistance state to a low resistance state as set pulses are applied to the synapse 30, and can gradually change from the low resistance state to the high resistance state as reset pulses are applied to the synapse 30. When the total resistance of the synapse 30 changes from the high resistance state to the low resistance state, the synapse 30 may gradually and sequentially change from the basic state shown in FIG. 4A, to the first resistance state shown in FIG. 4B, to the second resistance state shown in FIG. 4C, to the third resistance state shown in FIG. 4D. When the total resistance of the synapse 30 changes from the low resistance state to the high resistance state, the synapse 30 may be gradually and sequentially change from the third resistance state shown in FIG. 4D, to the second resistance state shown in FIG. 4C, to the first resistance state shown in FIG. 4B, to the basic state shown in FIG. 4A. That is, as electrical signals are applied to the synapse 30, the nano-tubes that connect to each other first may be the last nano-tubes that are released and/or disconnected from each other, and the nano-tubes that connect to each other last may be the first nano-tubes that are released and/or disconnected from each other.

Figure 5A:
FIG. 5A is a graph illustrating a conductance of a synapse of a neuromorphic device increasing as electrical signals are applied to the synapses according to an embodiment of the present disclosure.
Figure 5B:
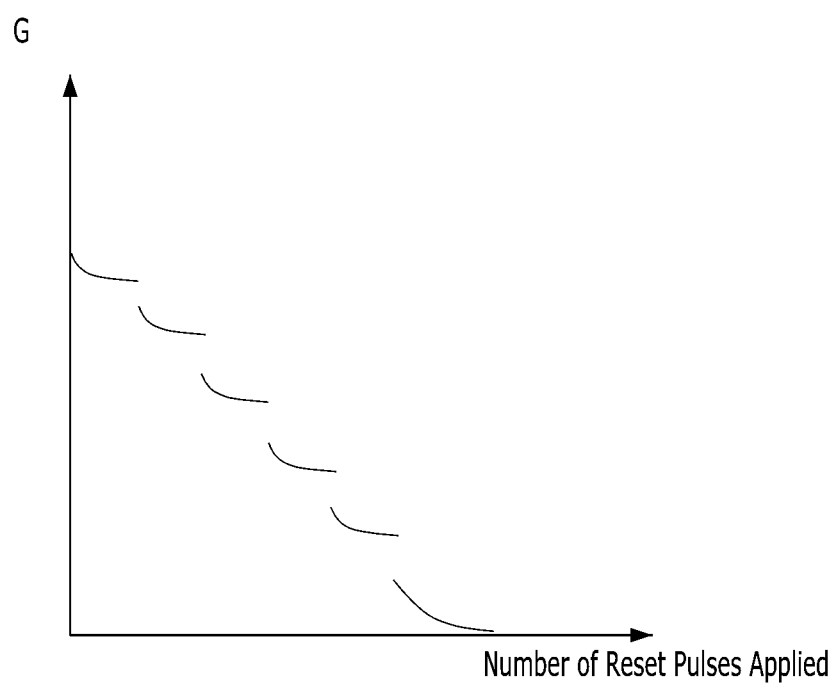
FIG. 5B is a graph illustrating a conductance of a synapse of a neuromorphic device decreasing.

FIG. 5A is a graph illustrating a conductance of a synapse of a neuromorphic device, which increases as electrical signals are applied to the synapse in accordance with an embodiment of the present disclosure. FIG. 5B is a graph illustrating the conductance of the synapse decreasing as electrical signals are applied to the synapse in accordance with an embodiment of the present disclosure.

Referring to FIG. 5A, a conductance G of a synapse 30 may gradually increase as first electrical signals, e.g., set pulses, are applied to the synapse 30. Referring to FIG. 5B, the conductance G of the synapse 30 may gradually decrease as second electrical signals, e.g., reset pulses, are applied to the synapse 30. The set pulses and the reset pulses may have opposite polarities or may be applied from opposite directions.

Figure 5C:
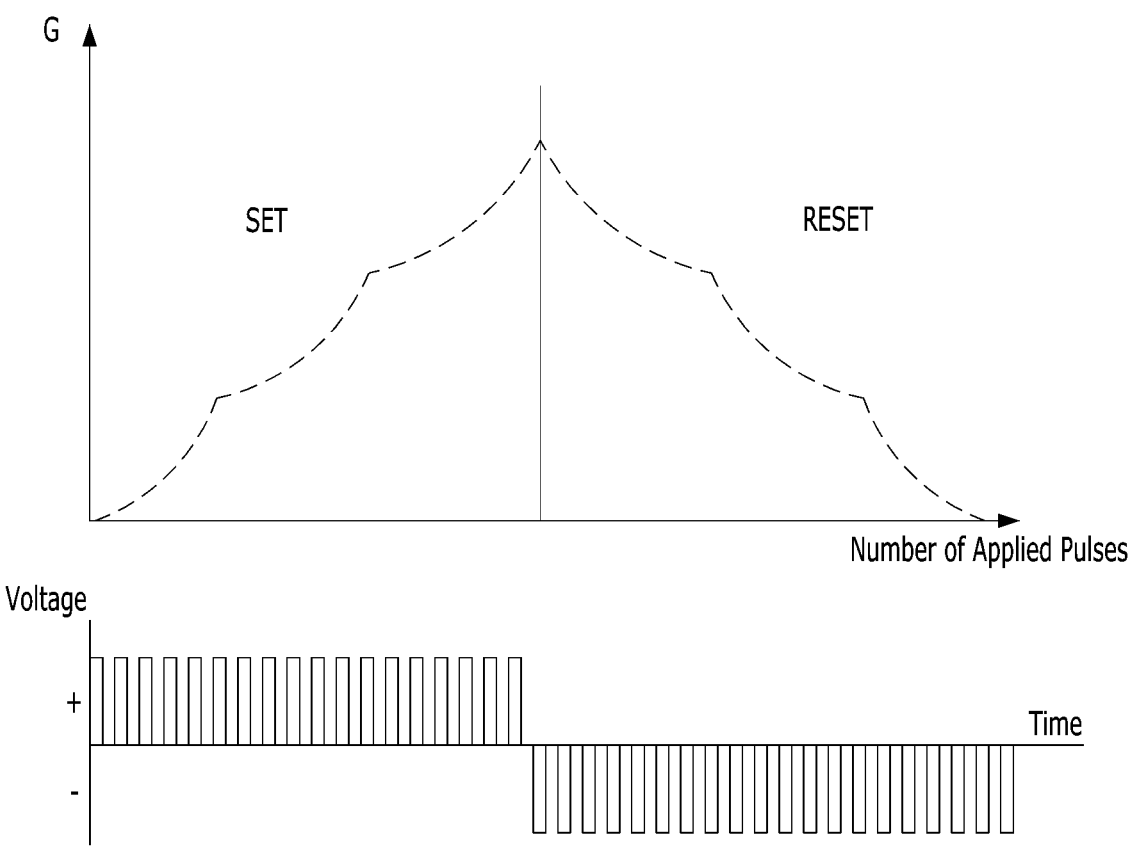
FIG. 5C is a graph illustrating a conductance of a synapse of a neuromorphic device that increases as set pulses are applied and decreases as reset pulses are applied.

FIG. 5C is a graph illustrating that a conductance G of a synapse 30 may analogously increase as set pulses are applied, and decrease as reset pulses are applied. Referring to FIG. 5C, the conductance G of the synapse 30 can be symmetrically changed in a set operation and a reset operation. Similarly the resistance of the synapse 30 can be symmetrically changed in the set operation and the reset operation. In other words, a graph plotting the conductance G versus the number of applied set pulses in the set operation is symmetric to a graph plotting the conductance G versus the number of reset pulses in the reset operation.

In the set operation, a conductance of one of the synapse layers 32 to 34 in the synapse 30 may linearly increase with respect to the number of set pulses applied to the synapse 30. However, in the reset operation, the conductance of the one of the synapse layers 32 to 34 may abruptly decrease. Specifically, when some carbon nano-tubes are released or disconnected from each other in one of the synapse layers 32 to 34, an electrical current may be concentrated in the carbon nano-tubes that are still connected to each other in the layer. Accordingly, a repulsion force between the connected carbon nano-tubes in the layer may be aggravated, and the connected carbon nano-tubes may very rapidly release and/or disconnect from each other. However, the conductance of the synapse layers 32 to 34, together, in the reset operation may be linear. Specifically, in the multi-layered carbon nano-tubes structure, when some carbon nano-tubes are released or disconnected from each other in one of the synapse layers 32 to 34, the electrical current can be distributed to the other synapse layers 32 to 34. That is, the concentration of current in the structure including the multi-layered carbon nano-tubes can be alleviated. Therefore, the conductance curves can be linear.

FIGS. 6A to 6F are longitudinal sectional views and a top view to illustrate a method for forming a neuromorphic device in accordance with an embodiment of the present disclosure.

Figure 6A:
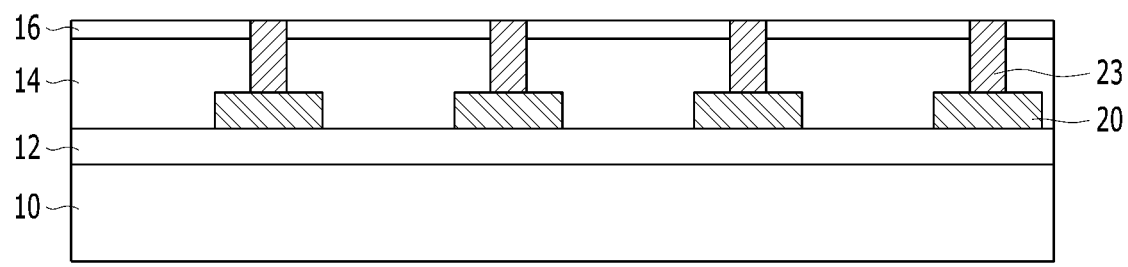
FIGS. 6A to 6F are longitudinal sectional views and a top view illustrating a method for forming a neuromorphic device in accordance with an embodiment of the present disclosure.

Referring to FIG. 6A, the method may include forming a surface insulating layer 12 on a substrate 10, forming lower interconnection layers 20 on the surface insulating layer 12, forming a lower interlayer insulating layer 14 and a lower stopper layer 16 on the lower interconnection layers 20, and forming lower via plugs 23. The via plugs 23 may vertically penetrate the lower stopper layer 16 and the lower interlayer insulating layer 14, and may be electrically connected with the lower interconnection layers 20, respectively.

The surface insulating layer 12 may be formed by using a deposition process or an oxidation process to form at least one of a silicon oxide layer, a silicon nitride layer, a silicon oxy-nitride layer, and another insulating material layer on the substrate 10.

The lower interconnection layers 20 may include conductive material patterns disposed on the surface insulating layer 12, and may have line shapes extending in a first direction, e.g., a direction pointing out of the page. The lower interconnection layers 20 may be formed using a deposition process, a photolithography process, an etching process, or a damascene process.

The lower interlayer insulating layer 14 and the lower stopper layer 16 may each include at least one of a silicon oxide layer, a silicon nitride layer, a silicon oxy-nitride layer, and another type of insulating material layer. The lower interlayer insulating layer 14 and the lower stopper layer 16 may be formed using a deposition process or an oxidation process. The lower interlayer insulating layer 14 and the lower stopper layer 16 may include different materials, such that the lower interlayer insulating layer 14 and the lower stopper layer 16 have different etch selectivities.

The lower via plugs 23 may be formed by forming lower via holes using a photolithography process and an etching process. The via holes may penetrate the lower interlayer insulating layer 14, and expose portions of the lower interconnection layers 20. The lower via holes may be filled with a conductive material using a deposition process, a planarization process, a plating process, or a damascene process.

Figure 6B:
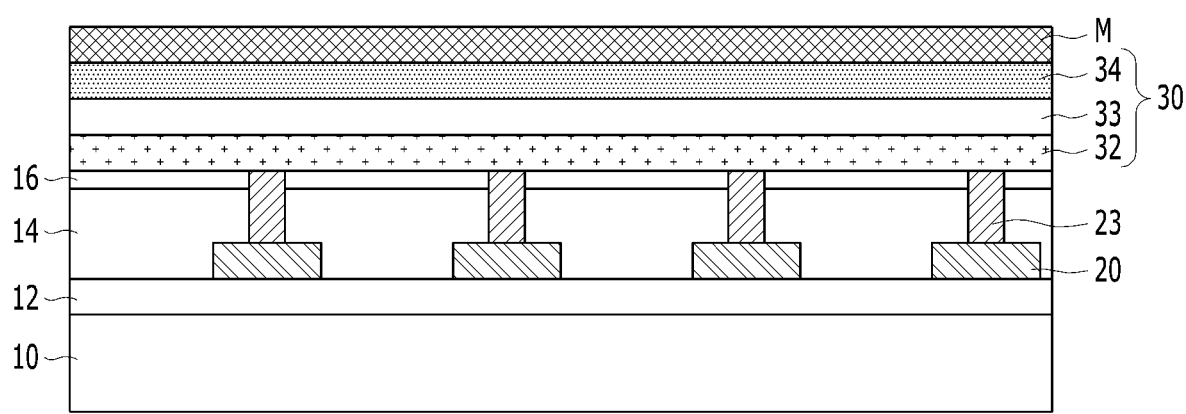

Referring to FIG. 6B, the method may include sequentially forming a lower synapse layer 32, a middle synapse layer 33, an upper synapse layer 34, and a mask layer M on the lower interlayer insulating layer 14, the lower stopper layer 16, and the lower via plugs 23. The lower synapse layer 32, the middle synapse layer 33, and the upper synapse layer 34 may be formed by performing three independent processes. For example, the lower synapse layer 32, the middle synapse layer 33, and the upper synapse layer 34 may each be formed independently using a spin coating process, a laser deposition process, a PE-CVD (plasma enhanced chemical vapor deposition) process, a VPG (vapor phase growth) process, or another process. The mask layer M may include a photoresist layer or a hard mask layer.

Figure 6C:
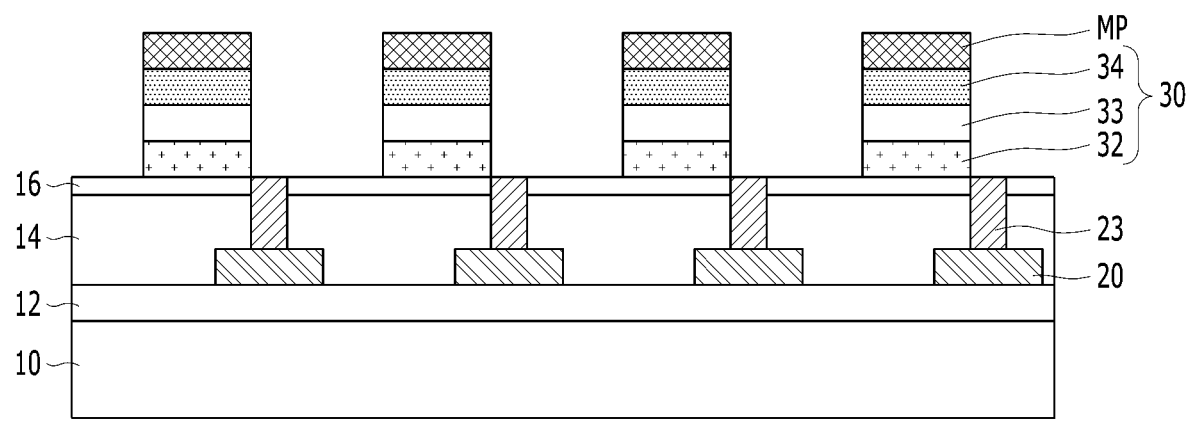

Referring to FIG. 6C, the method may further comprise forming a mask pattern MP using a photolithography process and an etching process, and forming synapses 30 using an etching process utilizing the mask pattern MP as an etch mask. The synapse 30 may extend in a line shape or may have a dam shape. A surface of the lower via plugs 23 may be exposed when forming the synapses 30.

Figure 6D:
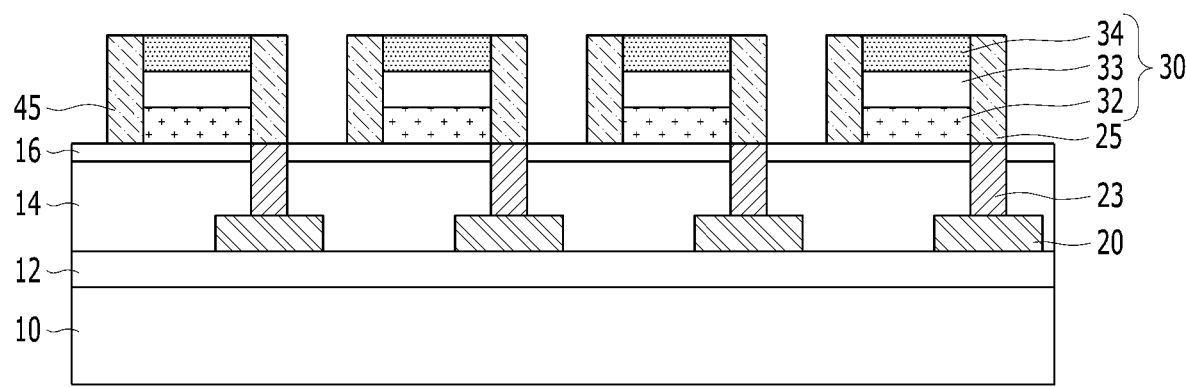

Referring to FIG. 6D, the method may further include forming lower electrodes 25 and upper electrodes 45 on both side surfaces of the synapses 30 using a deposition process and an etching process. The lower electrodes 25 and the upper electrodes 45 may be formed by wholly forming a conductive layer, and dividing the conductive layer into the lower electrodes 25 and the upper electrodes 45 using an etch-back process. The mask pattern MP may be removed at the same time when the lower electrodes 25 and the upper electrodes 45 are formed.

Figure 6E:
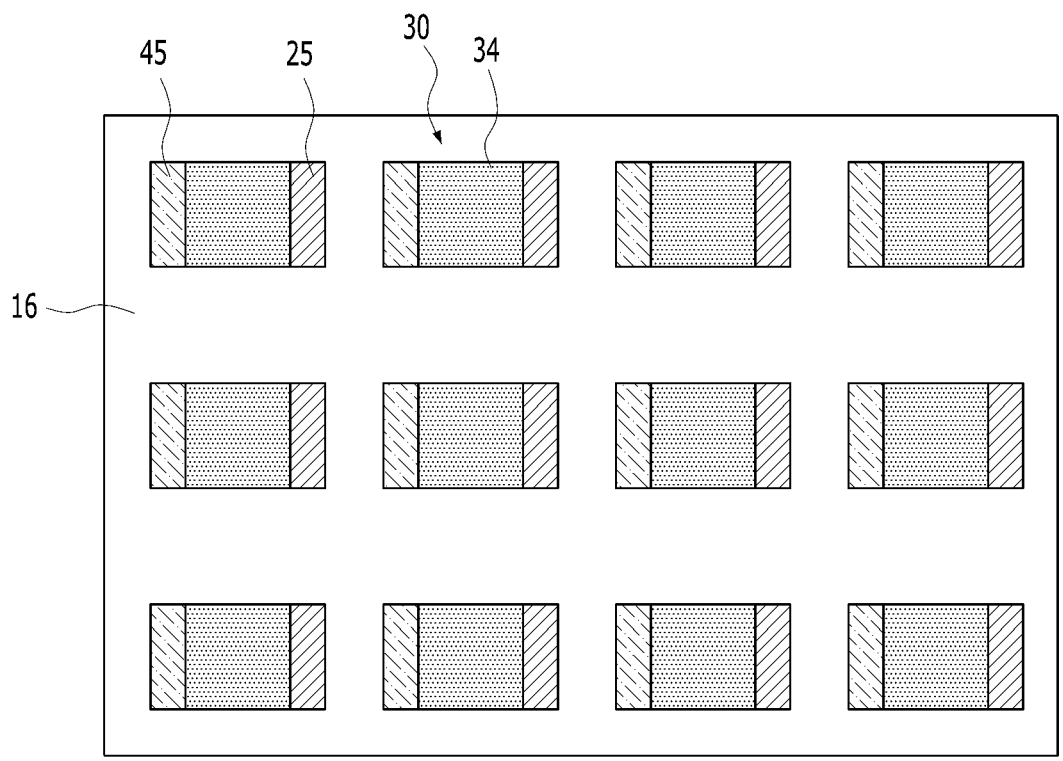

FIG. 6E is a top view illustrating the method. Referring FIG. 6E, the method further include dividing the synapses 30, the lower electrodes 25, and the upper electrodes 45 into island shapes using a photolithography process and an etching process. Accordingly, the synapses 30 can be arrayed as a plurality of latticed islands.

Figure 6F:
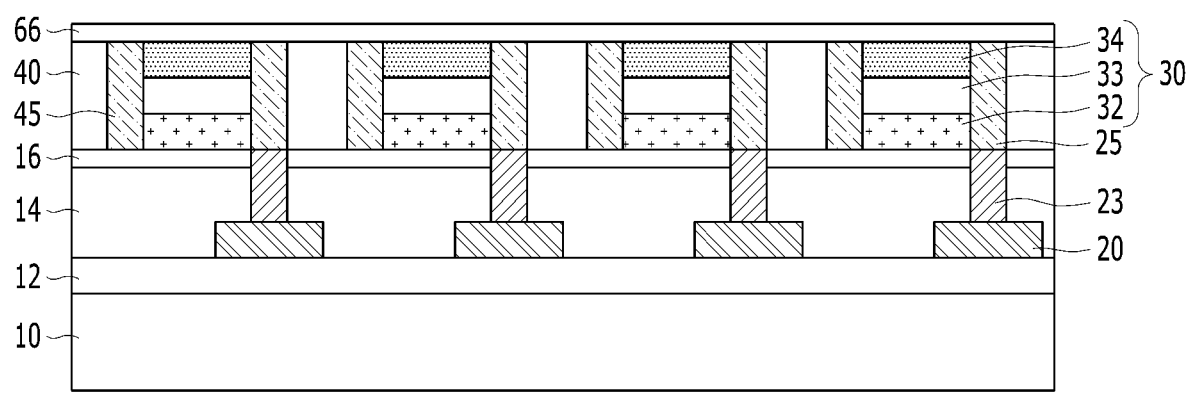

Referring to FIG. 6F, the method may further include filling spaces between the lower electrodes 25 and the upper electrodes 45 with a middle interlayer insulating layer 40; planarizing surfaces of the middle interlayer insulating layer 40, the synapses 30, the lower electrodes 25, and the upper electrodes 45; and forming an upper stopper layer 66. The interlayer insulating layer 40 may be formed by forming an insulating layer, such as a silicon oxide layer, using a deposition process or a filling process. The surfaces of the middle interlayer insulating layer 40, the synapses 30, the lower electrodes 25, and the upper electrodes 45 may be planarized by performing a chemical mechanical polishing (CMP) process. The upper stopper layer 66 may be formed by forming an insulating layer such as a silicon nitride layer on the planarized surfaces using deposition.

Referring to FIG. 2A, the method may additionally include forming the upper interlayer insulating layer 64 on the upper stopper layer 66, forming the upper via plugs 43 vertically penetrating the upper interlayer insulating layer 64, which are electrically connected with the upper electrodes 45, and forming the upper interconnection layer 50 on the upper interlayer insulating layer 64 and the upper via plugs, which is connected to and in contact with the upper via plugs 43.

The upper interlayer insulating layer 64 may include at least one of a silicon oxide layer, a silicon nitride layer, a silicon oxy-nitride layer, and another type of insulating layer. The upper interlayer insulating layer 64 may be formed using a deposition process or an oxidation process.

The upper via plugs 43 may be formed by forming upper via holes that vertically penetrate the upper interlayer insulating layer and expose surfaces of the upper electrodes 45 using a photolithography process and an etching process, and filling the upper via holes with a conductive material using a deposition process, a planarization process, a plating process, or a damascene process.

The upper interconnection layer 50 may include a conductive material pattern may have a line shape extending in a second direction, e.g., a horizontal direction. The upper interconnection layer 50 may be disposed on the upper interlayer insulating layer 64 and the upper via plugs 43. The upper interconnection layer 50 may be formed using a deposition process, a photolithography process, and an etching process, or a damascene process.

The upper interconnection layer 50 and the lower interconnection layers 20 may extend in respective directions that are perpendicular with each other.

Figure 7A:
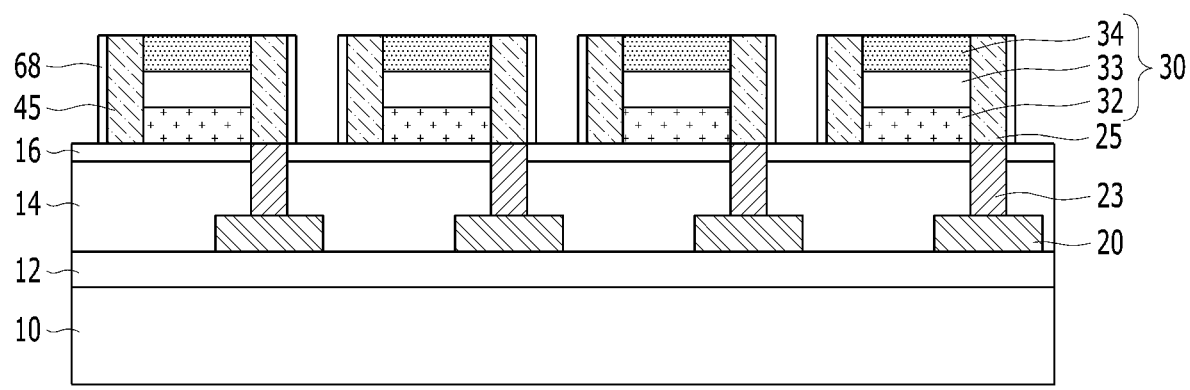
FIGS. 7A and 7B are a longitudinal sectional view and a top view illustrating a method for forming a neuromorphic device in accordance with an embodiment of the present disclosure.
Figure 7B:
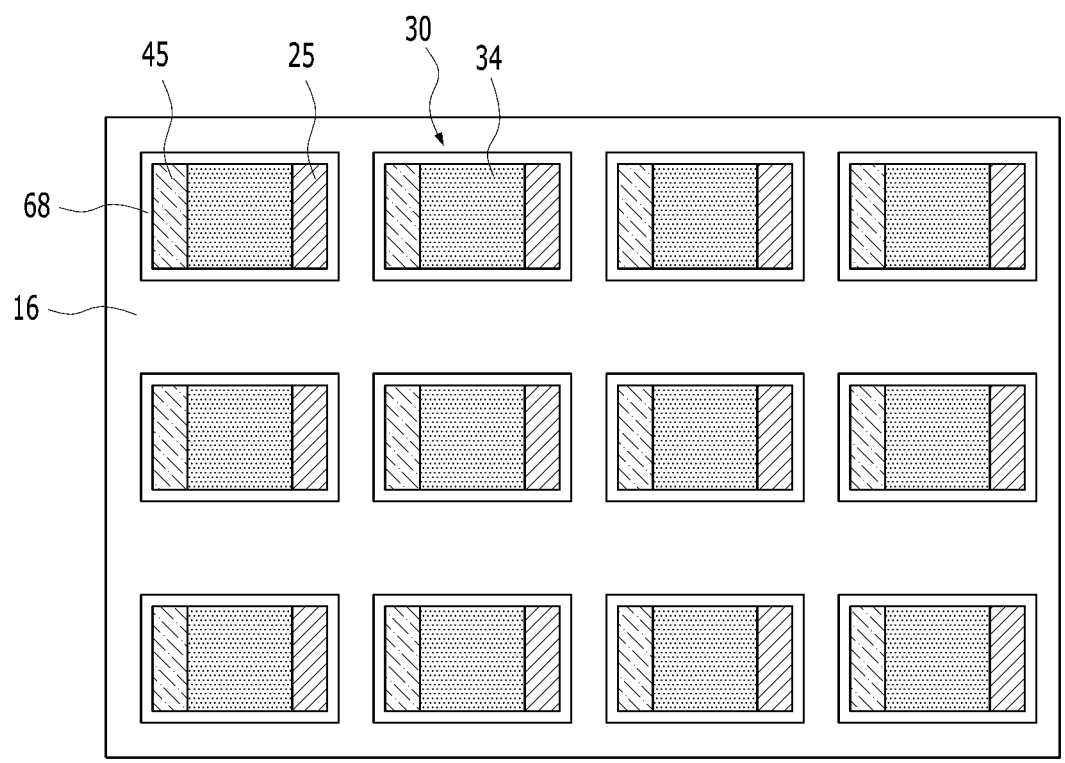

FIGS. 7A and 7B are a longitudinal sectional view and a top view illustrating a method for forming a neuromorphic device in accordance with an embodiment of the present disclosure.

Referring to FIGS. 7A and 7B, the method may include forming sidewall spacers 68 on exposed side surfaces of the synapses 30, the lower electrodes 25, and the upper electrodes 45, after performing the processes described in reference to FIGS. 6A to 6E. The sidewall spacers 68 may be formed by thin forming an insulating layer, such as a silicon nitride layer, using a deposition process.

Then, referring to FIG. 2B, the method may further include filling a space between the sidewall spacers 68 with a middle interlayer insulating layer 40; planarizing surfaces of the sidewall spacers 68; forming an upper stopper layer 66 using the processes described in reference to FIG. 6F; forming an upper interlayer insulating layer 64 on the upper stopper layer 66; forming upper via plugs 43 vertically penetrating the upper interlayer insulating layer 64, which are connected to and in contact with the upper electrodes 45; and forming an upper interconnection layer 50 on the upper interlayer insulating layer 64 and the upper via plugs 43, which are connected to and in contact with the upper interconnection layer 50.

FIGS. 8A to 8E are longitudinal sectional views illustrating a method for forming a neuromorphic device in accordance with an embodiment of the present disclosure.

Figure 8A:
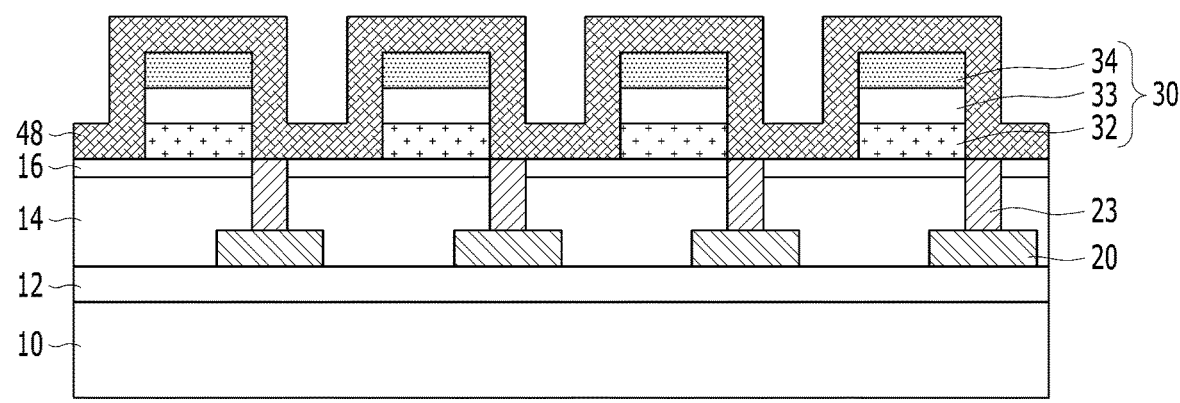
FIGS. 8A to 8E are longitudinal sectional views illustrating a method for forming a neuromorphic device in accordance with an embodiment of the present disclosure.

Referring to FIG. 8A, the method may include conformably forming a sacrificial layer 48 wholly on upper surfaces and side surfaces on the synapses 30 after performing the processed described in reference to FIGS. 6A to 6C. The sacrificial layer 48 may include a material, such as a silicon nitride having a different etch selectivity than the synapse layers 32 to 34 or a silicon oxide, and may be formed using a deposition process.

Figure 8B:
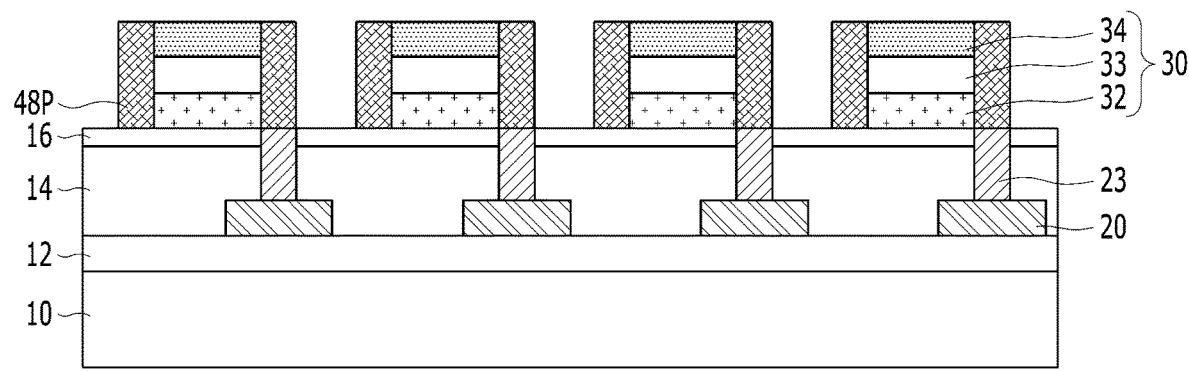

Referring to FIG. 8B, the method may include forming sacrificial patterns 48P on the side surfaces of the synapses 30, using an etch-back process, to partially remove the sacrificial layer 48.

Figure 8C:
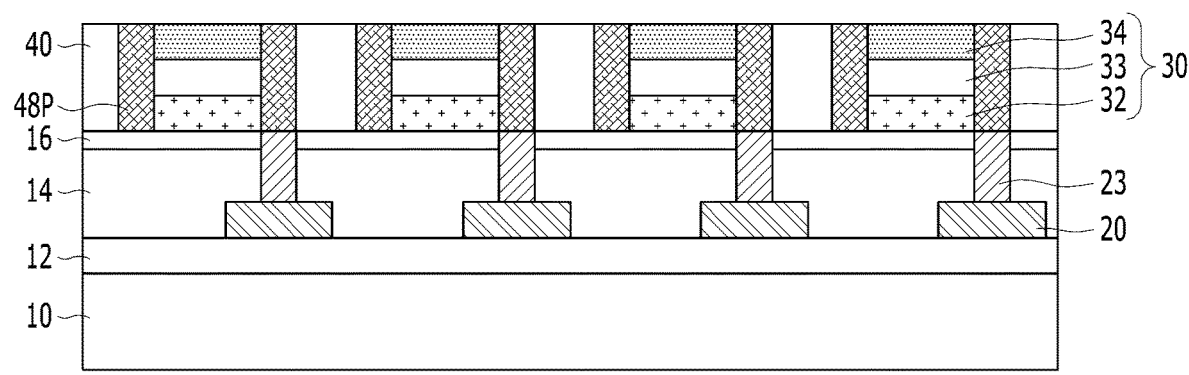

Referring to FIG. 8C, the method may include filling spaces between the sacrificial patterns 48P with a middle interlayer insulating layer 40.

Figure 8D:
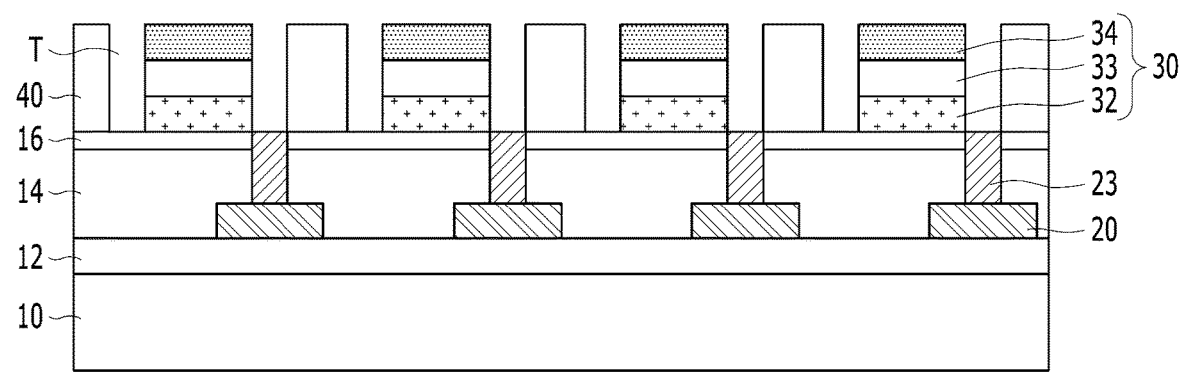

Referring to FIG. 8D, the method may include forming trenches T by selectively removing the sacrificial patterns 48P.

Figure 8E:
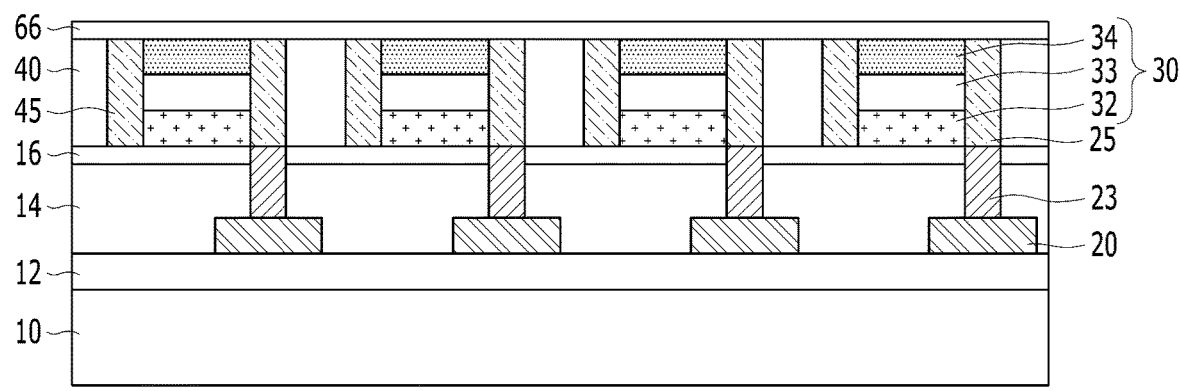

Referring FIG. 8E, the method may include forming lower electrodes 25 and upper electrodes 45 by filling the trenches T with a conductive material; dividing the synapses 30, the lower electrodes 25, and the upper electrodes 45 into island shapes using the processes described in reference to FIG. 6E; and forming an upper stopper layer 66 as described in reference to FIG. 6F.

Then, referring to FIG. 2A, the method may include forming an upper interlayer insulting layer 64 on the upper stopper layer 66, forming upper via plugs 43 vertically penetrating the upper interlayer insulating layer 64 and contacting the upper electrodes 45, and forming an upper interconnection layer 50 on the upper interlayer insulating layer 64 connected to and in contact with the upper via plugs 43.

Figure 9A:
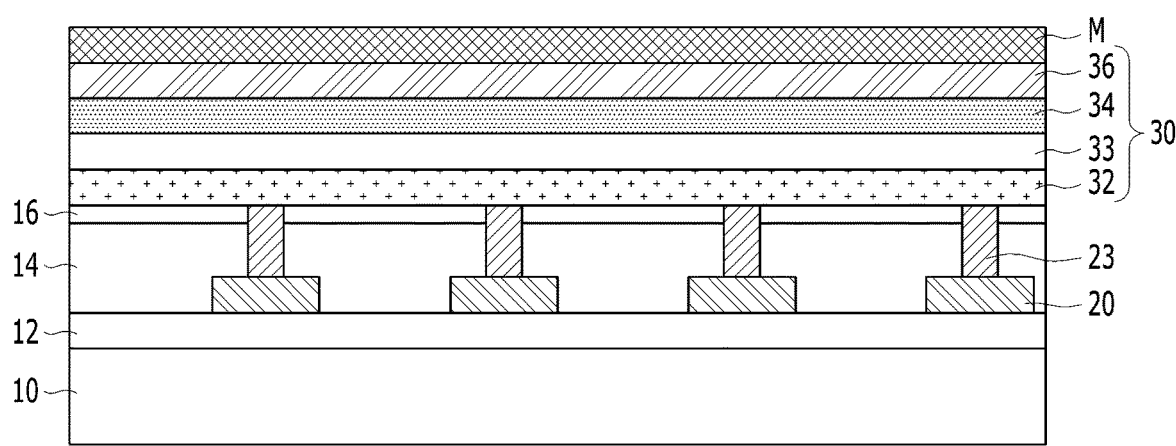
FIGS. 9A and 9B are longitudinal sectional views illustrating a method for forming a neuromorphic device in accordance with embodiments of the present disclosure.
Figure 9B:
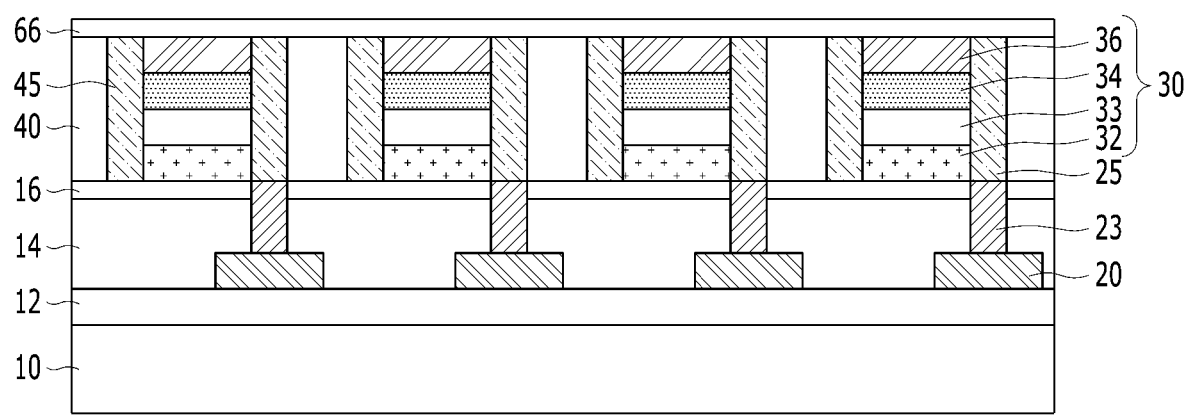

FIGS. 9A and 9B are longitudinal sectional views illustrating a method for forming a neuromorphic device in accordance with an embodiment of the present disclosure.

Referring to FIG. 9A, the method may include performing the processes for forming synapse layers 32, 33, and 34 described in reference to FIGS. 6A and 6B, and forming a capping layer 36 on the upper synapse layer 34. A mask layer M is formed on the capping layer 36.

Referring to FIG. 9B, the method may include forming synapses 30, which include the capping layer 36, lower electrodes 25, upper electrodes 45, a middle interlayer insulating layer 40, and an upper stopper layer 66, using the processes described in reference to FIG. 6C to 6F. Then, referring to FIG. 2C, the method may include forming an upper interlayer insulating layer 64, upper via plugs 43, and an upper interconnection layer 50.

Figure 10A:
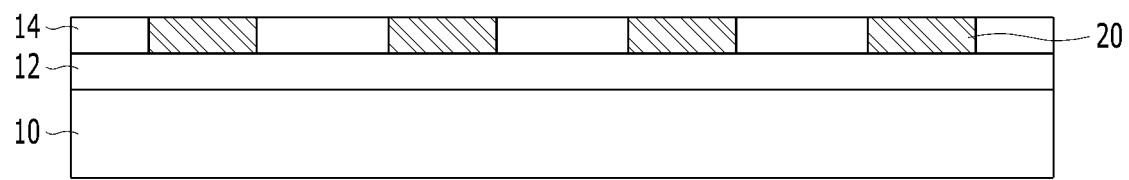
FIGS. 10A and 10B are longitudinal sectional views illustrating a method for forming a neuromorphic device in accordance with an embodiment of the present disclosure.
Figure 10B:
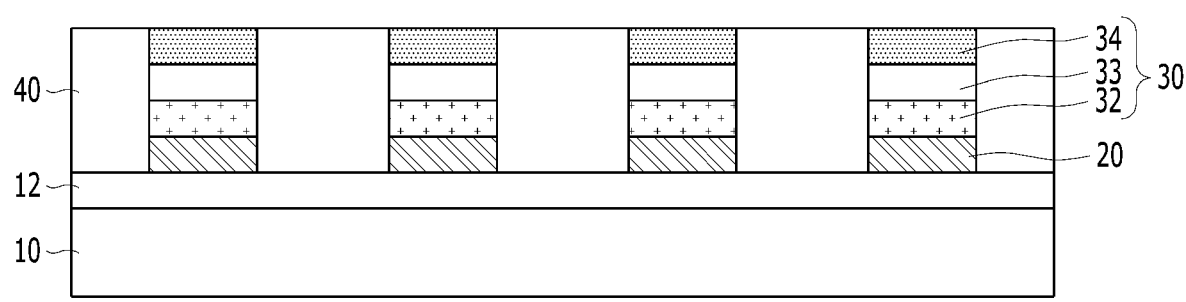

FIGS. 10A and 10B are longitudinal sectional views illustrating a method for forming a neuromorphic device in accordance with an embodiment of the present disclosure.

Referring to FIG. 10A, the method may include forming a surface insulating layer 12 on the substrate 10, forming lower interconnection layers 20 on the surface insulating layer 12, and forming a lower interlayer insulating layer 14 between the lower interconnection layers 20.

Referring to FIG. 10B, the method may include forming synapses 30 on the lower interconnection layers 20, and forming a middle interlayer insulating layer 40. Then, referring to FIG. 2E, the method may include forming an upper interconnection layer 50 on the synapses 30 and the middle interlayer insulating layer 40.

Figure 11:
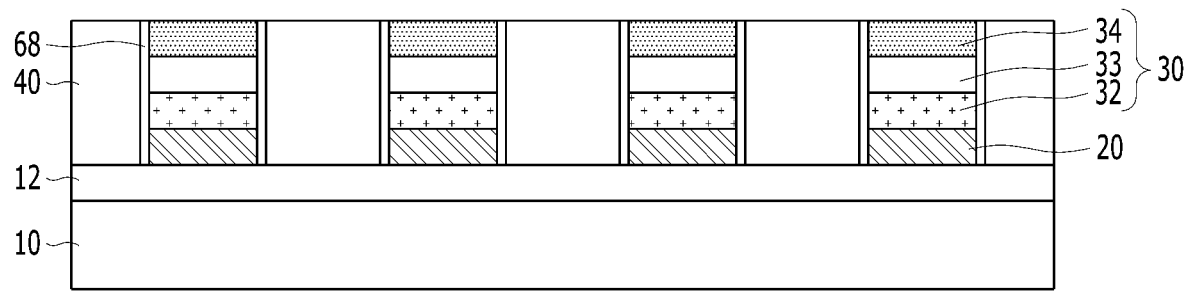
FIG. 11 is a longitudinal sectional view illustrating a method for forming a neuromorphic device in accordance with an embodiment of the present disclosure.

FIG. 11 is a longitudinal sectional view illustrating a method for forming a neuromorphic device in accordance with an embodiment of the present disclosure.

Referring to FIG. 11, the method may include forming synapses 30 on lower interconnection layers 20, forming sidewall spacers 68 on side surfaces of the synapses 30 and the lower interconnection layers 20, and forming a middle interlayer insulating layer 40 between the sidewall spacers 68 by performing the processes described in reference to FIGS. 10A and 10B. Then, referring to FIG. 2F, the method may include forming an upper interconnection layer 50 on the synapses 30, the sidewall spacers 68, and the middle interlayer insulating layer 40.

Figure 12A:
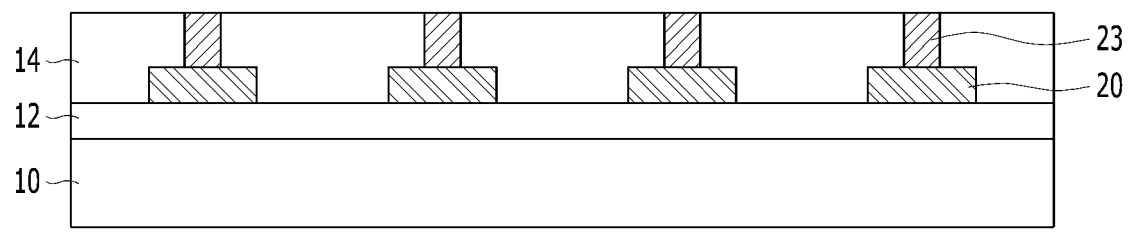
FIGS. 12A and 12B are longitudinal sectional views illustrating a method for forming a neuromorphic device in accordance with and embodiment of the present disclosure.
Figure 12B:
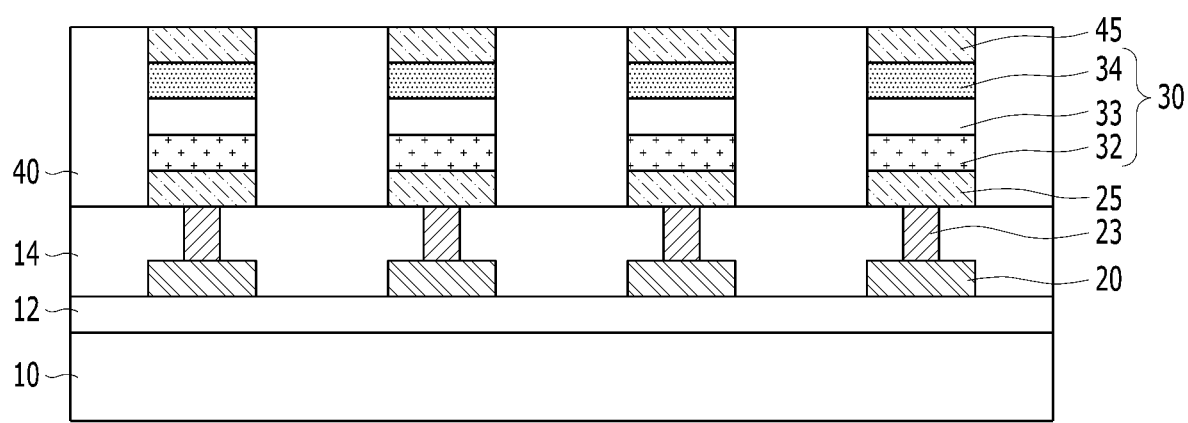

FIGS. 12A and 12B are longitudinal sectional views illustrating a method for forming a neuromorphic device in accordance with an embodiment of the present disclosure.

Referring to FIG. 12A, the method may include forming a surface insulating layer 12 on a substrate 10, forming lower interconnection layers 20 on the surface insulating layer 12, forming a lower interlayer insulating layer 14 that covers the lower interconnection layers 20, and forming lower via plugs 23 that vertically penetrate the lower interlayer insulating layer 14 and are connected with the lower interconnection layers 20, respectively.

Referring to FIG. 12B, the method may include forming lower electrodes 25, synapses 30, and upper electrodes 45 using a deposition process, a photolithography process, and an etching process; and forming a middle interlayer insulating layer 40 between the synapses 30 using a deposition process or a filling process. Then, referring to FIG. 2G, the method may include forming an upper interlayer insulating layer 64 on the upper electrodes 45 and the middle interlayer insulating layer 40, forming upper via plugs 43 that vertically penetrate the upper interlayer insulating layer 64 and are connected with the upper electrodes 45, respectively, and forming an upper interconnection layer 50 on the upper via plugs 43 and the upper interlayer insulating layer 64.

Figure 13:
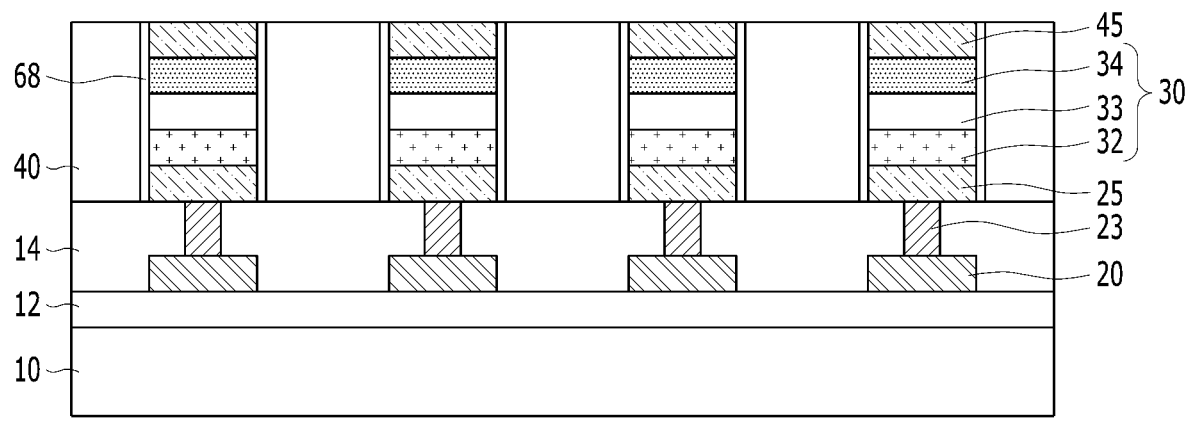
FIG. 13 is a longitudinal sectional view illustrating a method for forming a neuromorphic device in accordance with an embodiment of the present disclosure.

FIG. 13 is a longitudinal sectional view illustrating a method for forming a neuromorphic device in accordance with an embodiment of the present disclosure.

Referring to FIG. 13, the method may include forming lower electrodes 25, synapses 30, and upper electrodes 45 using the processes described in reference to FIGS. 12A and 12B; forming sidewall spacers 68 on side surfaces of the lower electrodes 25, the synapses 30, and the upper electrodes 45; and forming a middle interlayer insulating layer 40 between the sidewall spacers 68. Then, referring FIG. 2H, the method may include forming an upper interlayer insulating layer 64 on the upper electrodes 45, forming upper via plugs 43, and forming an upper interconnection layer 50.

Figure 14:
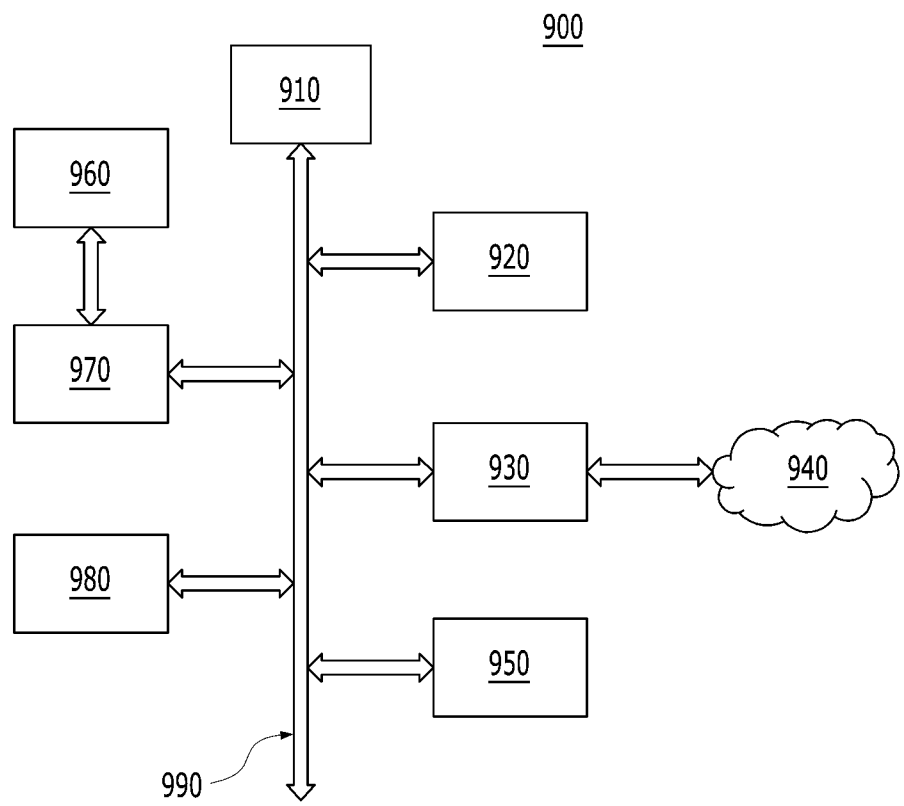
FIG. 14 is a diagram schematically illustrating a pattern recognition system in accordance with an embodiment of the present disclosure.

FIG. 14 is a diagram schematically illustrating a pattern recognition system 900 in accordance with an embodiment of the present disclosure. For example, the pattern recognition system 900 may include any of a speech recognition system, an imaging recognition system, a code recognition system, a signal recognition system, and one or more systems for recognizing various patterns.

Referring to FIG. 14, the pattern recognition system 900 may include a Central Processing Unit (CPU) 910, a memory unit 920, a communication control unit 930, a network 940, an output unit 950, an input unit 960, an Analog-Digital Converter (ADC) 970, a neuromorphic unit 980, and/or a bus 990. The CPU 910 may generate and transmit various signals for a learning process of the neuromorphic unit 980, and perform various processes and functions for recognizing patterns according to an output from the neuromorphic unit 980. For example, the CPU 910 may perform processes and functions for recognizing speech and imaging patterns based on an output from the neuromorphic unit 980.

The CPU 910 may be connected with the memory unit 920, the communication control unit 930, the output unit 950, the ADC 970, and the neuromorphic unit 980 through the bus 990.

The memory unit 920 may store various pieces of information, which may be stored in the pattern recognition system 900. The memory unit 920 may include one or more of a volatile memory device, such as a DRAM or an SRAM device; a nonvolatile memory, such as PRAM, MRAM, ReRAM or NAND flash memory; and various memory units, such as a Hard Disk Drive (HDD) and a Solid State Drive (SSD).

The communication control unit 930 may transmit and/or receive data to and/or from a communication control unit of another system through the network 940. For example, the communication control unit 930 may transmit speech and/or image recognition data through the network 940.

The output unit 950 may output data in various manners. For example, the output unit 950 may include a speaker, a printer, a monitor, a display panel, a beam projector, a hologrammer, and/or other various output devices. The output unit 950 may output, for example, speech and/or image recognition data.

The input unit 960 may include a microphone, a camera, a scanner, a touch pad, a keyboard, a mouse, a mouse pen, and/or one or more of various sensors.

The ADC 970 may convert analog data inputted from the input unit 960 into digital data.

The neuromorphic unit 980 may perform learning or recognition using the data outputted from the ADC 970, and output data corresponding to recognized patterns. The neuromorphic unit 980 may include one or more of the neuromorphic devices in accordance with the various embodiments described above.

The neuromorphic devices in accordance with various embodiments of the present disclosure can include synapses having the carbon nano-tubes, such that the neuromorphic devices can have excellent mechanical and electrical characteristics.

The neuromorphic devices in accordance with various embodiments of the present disclosure can include synapses having the carbon nano-tubes, such that the neuromorphic device can have excellent endurance and semi-permanent data retention.

The neuromorphic devices in accordance with various embodiments of the present disclosure can include synapses having the carbon nano-tubes, such that the neuromorphic device can have a very small size.

The neuromorphic devices in accordance with various embodiments of the present disclosure can be made using processes at low temperatures and at atmospheric pressure, so that cost of producing the neuromorphic device can be reduced.

Although various embodiments have been described for illustrative purposes, it will be apparent to those skilled in the art that various changes and modifications may be made without departing from the spirit and scope of the disclosure, as defined in the following claims.

What is claimed is:

1. A neuromorphic device comprising:
a pre-synaptic neuron;
a row line extending in a row direction from the pre-synaptic neuron;
a post-synaptic neuron;
a column line extending in a column direction from the post-synaptic neuron; and
a synapse disposed at an intersection between the row line and the column line,
wherein the synapse comprises:
a first synapse layer including a plurality of first carbon nano-tubes;
a second synapse layer including a plurality of second carbon nano-tubes having different structures from the plurality of first carbon nano-tubes; and
a third synapse layer including a plurality of third carbon nano-tubes having different structures from the plurality of first carbon nano-tubes and the plurality of second carbon nano-tubes,
wherein the synapse further comprises a capping layer disposed on the first to third synapse layers,
wherein the capping layer comprises a plurality of horizontal carbon nano-tubes that are densely and horizontally arranged in the capping layer, the plurality of horizontal carbon nano-tubes being arranged denser than the pluralities of the first to third carbon nano-tubes, and
wherein the first synapse layer, the second synapse layer, the third synapse layer, and the capping layer are vertically stacked and horizontally disposed in parallel with each other.

2. The neuromorphic device of claim 1, wherein the plurality of first carbon nano-tubes have first lengths, the plurality of second carbon nano-tubes have second lengths, and the plurality of third carbon nano-tubes have third lengths, the first lengths, the second lengths, and the third lengths being different from each other.

3. The neuromorphic device of claim 1, wherein the plurality of first carbon nano-tubes have first diameters, the plurality of second carbon nano-tubes have second diameters, and the plurality of third carbon nano-tubes have third diameters, the first diameters, the second diameters, and the third diameters being different from each other.

4. The neuromorphic device of claim 1, wherein the plurality of first carbon nano-tubes includes single-wall nano-tubes, the plurality of second carbon nano-tubes includes double-wall nano-tubes, and the plurality of third carbon nano-tubes includes multi-wall nano-tubes.

5. The neuromorphic device of claim 1, wherein lengths of the horizontal carbon nano-tubes are longer than lengths of the first to third carbon nano-tubes.

6. The neuromorphic device of claim 1, wherein the synapse further comprises:
a fourth synapse layer including a plurality of fourth carbon nano-tubes having different structures from the first to third carbon nano-tubes; and
a fifth synapse layer including a plurality of fifth carbon nano-tubes having different structures from the pluralities of first to fourth carbon nano-tubes.

7. A neuromorphic device comprising:
a lower electrode;
an upper electrode;
a synapse disposed between the lower electrode and the upper electrode;
a first sidewall spacer; and
a second sidewall spacer,
wherein the synapse includes:
a lower synapse layer having a plurality of first carbon nano-tubes;
a middle synapse layer having a plurality of second carbon nano-tubes; and
an upper synapse layer having a plurality of third carbon nano-tubes,
wherein the lower synapse layer, the middle synapse layer, and the upper synapse layer are in parallel with each other, and
wherein the lower synapse layer, the middle synapse layer, and the upper synapse layer each contact the lower electrode and the upper electrode,
wherein the first sidewall spacer is disposed on an outer side surface of the lower electrode, and the second sidewall spacer is disposed on an outer side surface of the upper electrode,
wherein the outer side surface of the lower electrode is opposite to the outer side surface of the upper electrode,
wherein the synapse further comprises a capping layer disposed on the upper synapse layer, and
wherein the capping layer comprises a plurality of horizontal carbon nano-tubes that are densely and horizontally arranged in the capping layer, the plurality of horizontal carbon nano-tubes being arranged denser than the pluralities of the first to third carbon nano-tubes.

8. The neuromorphic device of claim 7,
wherein second lengths of the plurality of second carbon nano-tubes are longer than first lengths of the plurality of first carbon nano-tubes, and
wherein third lengths of the plurality of third carbon nano-tubes are longer than the second lengths of the plurality of second carbon nano-tubes.

9. The neuromorphic device of claim 7,
wherein second diameters of the plurality of second carbon nano-tubes are greater than first diameters of the plurality of first carbon nano-tubes, and
wherein third diameters of the plurality of third carbon nano-tubes are greater than the second diameters of the plurality of second carbon nano-tubes.

10. The neuromorphic device of claim 7, wherein:
the plurality of first carbon nano-tubes includes single-wall nano-tubes,
the plurality of second carbon nano-tubes includes double-wall nano-tubes, and
the plurality of third carbon nano-tubes includes multi-wall nano-tubes.

11. The neuromorphic device of claim 7,
wherein lengths of the horizontal carbon nano-tubes are longer than lengths of the plurality of third carbon nano-tubes.

12. The neuromorphic device of claim 7, further comprising:
a lower interconnection layer;
a lower via plug connecting the lower interconnection layer to the lower electrode;
an upper interconnection layer; and
an upper via plug connecting the upper interconnection layer to the upper electrode.

13. The neuromorphic device of claim 12,
wherein the lower interconnection layer and the upper interconnection layer extend in different directions, the different directions being perpendicular with each other.

14. A neuromorphic device comprising:
a lower electrode;
an upper electrode;
a synapse disposed between the lower electrode and the upper electrode;
a first sidewall spacer; and
a second sidewall spacer,
wherein the synapse includes:
a lower synapse layer having a plurality of first carbon nano-tubes;
a middle synapse layer having a plurality of second carbon nano-tubes; and
an upper synapse layer having a plurality of third carbon nano-tubes,
wherein the lower synapse layer, the middle synapse layer, and the upper synapse layer are in parallel with each other,
wherein the first sidewall spacer is disposed on first side surfaces of the lower synapse layer, the middle synapse layer, and the upper synapse layer,
wherein the second sidewall spacer is disposed on second side surfaces of the lower synapse layer, the middle synapse layer, and the upper synapse layer, the first sidewall surfaces being opposite to the second sidewall surfaces,
wherein the first and second sidewall spacers include an insulating material,
wherein the synapse further comprises a capping layer disposed on the upper synapse layer, and
wherein the capping layer comprises a plurality of horizontal carbon nano-tubes that are densely and horizontally arranged in the capping layer, the plurality of horizontal carbon nano-tubes being arranged denser than the pluralities of the first to third carbon nano-tubes.

15. The neuromorphic device of claim 7,
wherein the lower electrode is in direct contact with a first side surface of the lower synapse layer, a first side surface of the middle synapse layer, and a first side surface of the upper synapse layer,
wherein the upper electrode is in contact with a second side surface of the lower synapse layer, a second side surface of the middle synapse layer, and a second side surface of the upper synapse layer, and
wherein the first side surfaces are opposite to the second side surfaces.

* * * * *